United States Patent
Ishii et al.

(10) Patent No.: US 9,786,579 B2
(45) Date of Patent: *Oct. 10, 2017

(54) IMAGING DEVICE, IMAGING APPARATUS, PRODUCTION APPARATUS AND METHOD, AND SEMICONDUCTOR DEVICE

(71) Applicant: SONY SEMICONDUCTOR SOLUTIONS CORPORATION, Kanagawa (JP)

(72) Inventors: Shunsuke Ishii, Kumamoto (JP); Satoshi Keino, Kumamoto (JP); Tomohiro Wada, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/994,126

(22) Filed: Jan. 12, 2016

(65) Prior Publication Data

US 2016/0204152 A1 Jul. 14, 2016

Related U.S. Application Data

(63) Continuation of application No. 14/212,300, filed on Mar. 14, 2014, now Pat. No. 9,245,823.

(30) Foreign Application Priority Data

Mar. 27, 2013 (JP) .................... 2013-065327

(51) Int. Cl.
H01L 31/00 (2006.01)
H01L 23/48 (2006.01)
H01L 27/146 (2006.01)

(52) U.S. Cl.
CPC ........ *H01L 23/48* (2013.01); *H01L 27/14605* (2013.01); *H01L 27/14609* (2013.01); *H01L 27/14623* (2013.01); *H01L 27/14636* (2013.01); *H01L 27/14638* (2013.01); *H01L 27/14641* (2013.01); H01L 2924/0002 (2013.01); *Y10T 29/41* (2015.01)

(58) Field of Classification Search
USPC ....................................... 257/459
See application file for complete search history.

(56) References Cited

U.S. PATENT DOCUMENTS

| | | | |
|---|---|---|---|
| 6,710,370 B2 * | 3/2004 | Street .................. | H01L 27/1463 257/448 |
| 7,696,529 B2 * | 4/2010 | Choo ................ | G02F 1/133555 257/114 |
| 7,755,158 B2 * | 7/2010 | Lee ................... | H01L 27/14636 257/290 |
| 8,228,425 B2 * | 7/2012 | Cieslinski ............. | H04N 5/335 257/459 |

* cited by examiner

*Primary Examiner* — Thao P Le
(74) *Attorney, Agent, or Firm* — Chip Law Group

(57) ABSTRACT

There is provided an imaging device including a semiconductor having a light-receiving portion that performs photoelectric conversion of incident light, electrically conductive wirings, and a contact group including contacts that have different sizes and connect the semiconductor and the electrically conductive wirings.

20 Claims, 14 Drawing Sheets

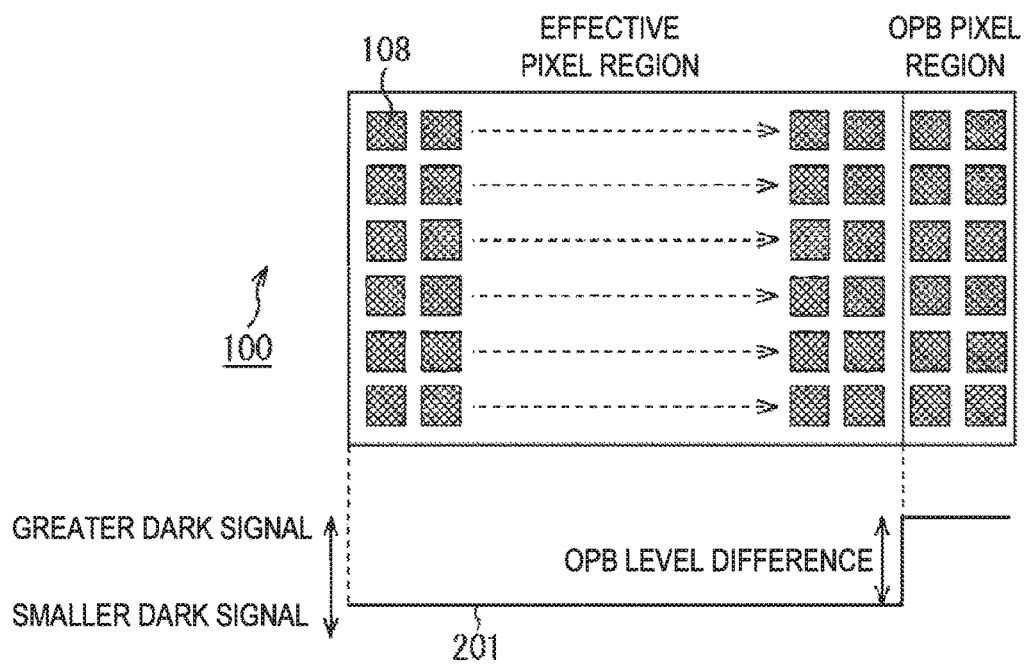
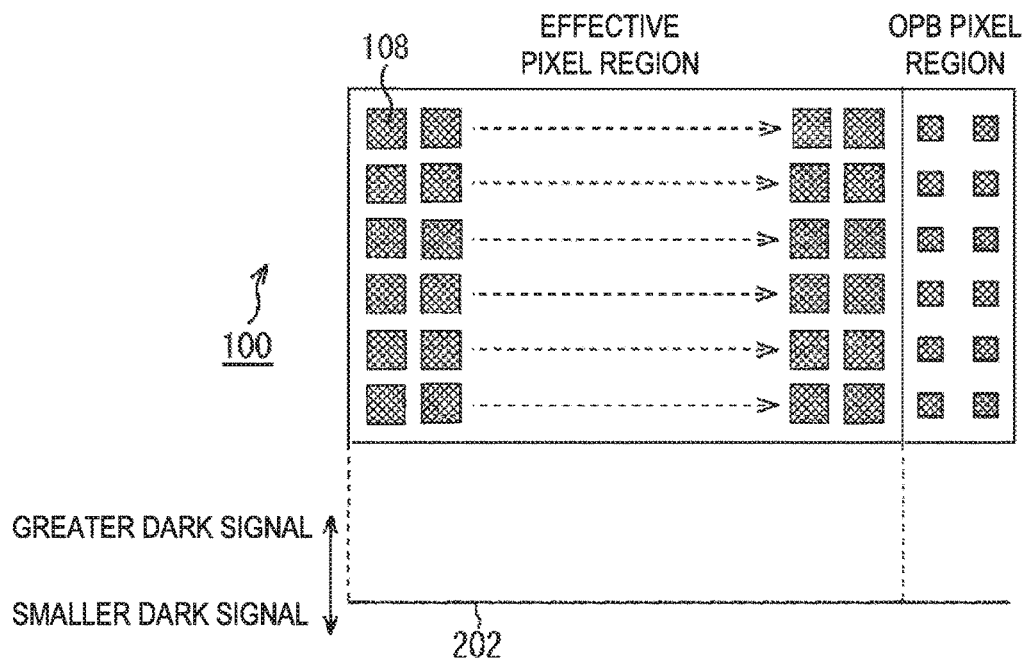

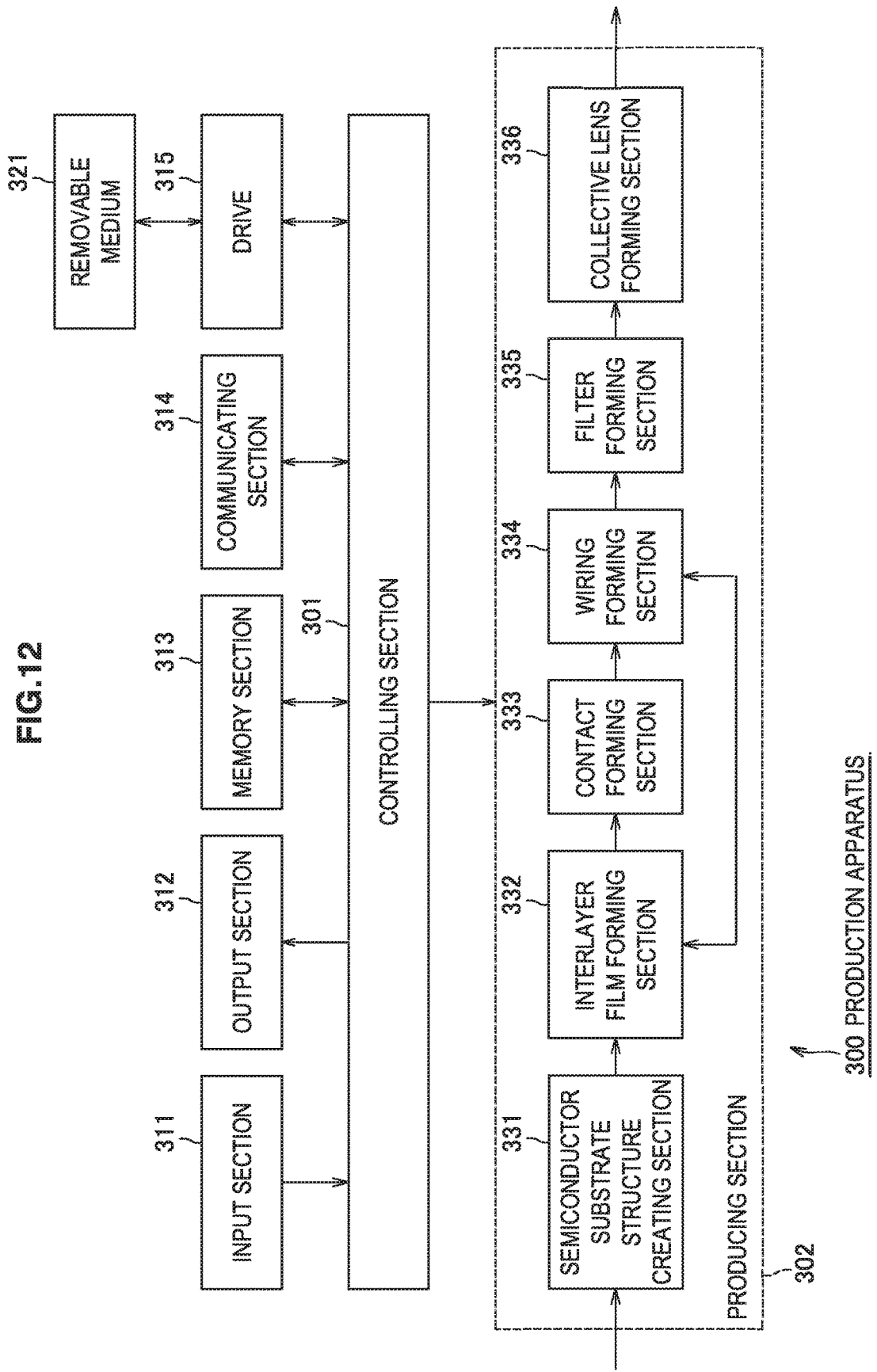

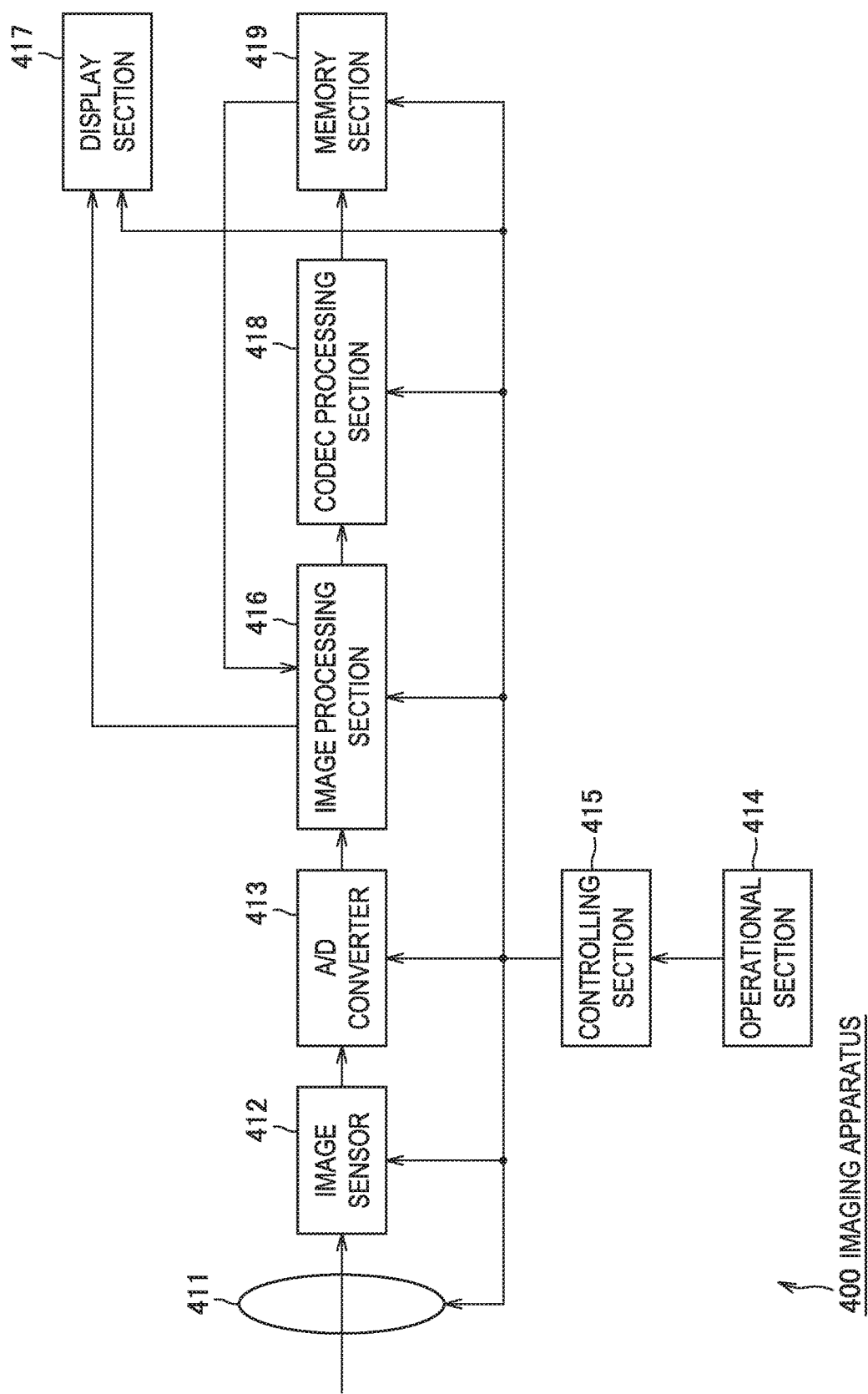

IMAGING DEVICE, IMAGING APPARATUS, PRODUCTION APPARATUS AND METHOD, AND SEMICONDUCTOR DEVICE

CROSS REFERENCE TO RELATED APPLICATIONS

The present application is a Continuation application of U.S. patent application Ser. No. 14/212,300 filed on Mar. 14, 2014 which claims priority of Japanese Patent Application No. 2013-065327 filed on Mar. 27, 2013, the disclosures of which are incorporated herein reference.

BACKGROUND

The present technology relates to an imaging device, an imaging apparatus, a production apparatus and method, and a semiconductor device. Specifically, the present technology relates to an imaging device, an imaging apparatus, a production apparatus and method, and a semiconductor device that are capable of appropriately and easily controlling a level of a dark signal.

In the past, there may have been caused an Optical Black (OPB) level difference which is a difference between a dark signal in an effective pixel and a dark signal in an Optical Black (OPB) pixel in an imaging device. In addition, even within an effective pixel region, the dark signal tends to vary pixel to pixel. For example, in a peripheral region of the effective pixel (a frame-shaped region), dark signal shading where the dark signal is gradually increased may be caused.

As a method of controlling or correcting such a dark signal, the following various methods have been considered.

For example, in order to control a dark signal, there has been a method of controlling the dark signal by adjusting conversion efficiencies through adjustment of a gate area of an amplifier transistor (see JP 3326940B, for example). This method may raise a concern of reduction of mutual conductance (gm) due to an increased gate area or occurrence of short channeling due to a reduced gate area, which lead to gain variability.

In addition, there is also a method of adjusting conversion efficiencies through adjustment of a wiring pattern or a diffusion layer, thereby to control the dark signal (see JP 2006-165006A, for example). However, there is a concern that changes of conversion efficiencies may lead to variations of image capturing characteristics at the time of a bright state, which may result in degraded image quality at the time of a bright state.

Moreover, there is also a method of changing sensor potentials, thereby to control the dark signal (see JP 2012-23319A, for example). In this method, a readout voltage, a saturation signal amount, and sensitivity are greatly affected, which may lead to degraded image quality at the time of a bright state.

Furthermore, there is also a method of controlling the dark signal through adjustment of an implantation layout around a pixel ground (GND) contact (see JP 2011-210837A, for example). In this method, because P+ ions are implanted at a relatively high concentration in the vicinity of an N-type region of a photodiode, occurrence of white dots or dark electric current may be concerned. In addition, because the high concentrated P+ region exists below element isolation, a depletion layer of the photodiode may be limited in a transverse direction, which may raise a concern of deterioration of saturation or sensitivity characteristics. Moreover, when donor impurities are doped at a relatively high concentration as countermeasures of such deterioration, the white points or dark electric current may become more problematic.

In addition, there is a method of reducing a degree of shading in the effective pixel by greatly enlarging a pixel extension region outside the effective pixel region in order to suppress an effect of the dark signal shading, which is typified by non-uniformity of dark electric currents in frame regions. In this method, a size of a chip may be increased by an amount of the pixel extension region, which may directly lead to decreased production yield and increased production costs.

Moreover, there is a method of correcting the OPB level difference and the dark signal shading by utilizing a pixel signal process. In this method, additional memories are necessary for the signal process, which may raise a concern of degraded image quality due to noises associated with the process.

Even in any of the methods described above, there are concerns about a degraded image quality and a complicated controlling technique. Therefore, there has been a demand for a technology that controls only the dark signal with a simplified technique, without degrading a quality of an image.

The present technology has been made in view of the above circumstances, and thus provides appropriate and easy control of a dark signal level.

According to an embodiment of the present technology, there is provided an imaging device including a semiconductor having a light-receiving portion that performs photoelectric conversion of incident light, electrically conductive wirings, and a contact group including contacts that have different sizes and connect the semiconductor and the electrically conductive wirings.

Ground contacts within the contact group may have different sizes, the ground contacts connecting a pixel well region of the semiconductor and the electrically conductive wirings at a ground potential.

A size of at least one of the ground contacts in an optical black region of the semiconductor may be different from a size of at least one of the ground contacts in an effective pixel region of the semiconductor.

The ground contacts in the optical black region may have a first size, and the ground contacts in the effective pixel region have a second size that is different from the first size.

The ground contacts in the effective pixel region may have a predetermined size, and the ground contacts in the optical black region have different sizes.

The ground contacts in an effective pixel region of the semiconductor may have different sizes.

Each of the ground contacts in the effective pixel region may have a size in accordance with an image height.

Sizes of the ground contacts in a part of the effective pixel region may be different from sizes of the ground contacts in another part of the effective pixel region.

A size of a ground contact that connects a pixel well region of the semiconductor and a corresponding one of the electrically conductive wirings at a ground potential may be different from a size of another contact excluding the ground contact, within the contact group.

The another contact may include at least one of a power source contact that connects a circuit element formed in the semiconductor and a corresponding one of the electrically conductive wirings at power source potential, a floating diffusion contact that connects a floating diffusion formed in the semiconductor and a corresponding one of the electrically conductive wirings, and a vertical signal line contact that connects a select transistor formed in the semiconductor and a corresponding one of the electrically conductive wirings.

Only the ground contact may have a predetermined size, and other contacts excluding the ground contact may have a plurality of different sizes.

Only the ground contacts may have a plurality of different sizes, and other contacts excluding the ground contact may have a predetermined size.

According to another embodiment of the present technology, there is provided an imaging apparatus including an imaging device including a semiconductor having a light-receiving portion that performs photoelectric conversion of incident light, electrically conductive wirings, and a contact group including contacts that have different sizes and connect the semiconductor and the electrically conductive wirings, and an image processing section that processes an image of a subject, the image having undergone the photoelectric conversion in the imaging device.

According to further another embodiment of the present technology, there is a production apparatus configured to produce an imaging device, the production apparatus including a setting section that sets different sizes of a plurality of contacts that connect a semiconductor and electrically conductive wirings, a semiconductor element forming section that forms elements in the semiconductor, the elements including a light-receiving portion that performs photoelectric conversion of incident light, a contact forming section that forms the contacts in accordance with setting of the setting section, and an electrically conductive wiring forming section that forms the electrically conductive wirings.

The setting section may set a size of a ground contact that connects a pixel well region of the semiconductor and a corresponding one of the electrically conductive wirings at a ground potential.

The setting section may set sizes of the ground contacts in an effective pixel region and in an optical black region in accordance with a difference between a dark signal level in the effective pixel region and a dark signal level in the optical black region.

The setting section may set sizes of the ground contacts in an effective pixel region in accordance with variations of dark signal levels due to positions of the wound contacts in the effective pixel region.

The setting section may set a size of the ground contact of an abnormal pixel in accordance with a difference between a dark signal level of the abnormal pixel and a dark signal level of a normal pixel.

According to further another embodiment of the present technology, there is a production method performed by a production apparatus that produces an imaging device, the production method including setting different sizes for contacts that connect a semiconductor and electrically conductive wirings, forming in the semiconductor, an element including a light-receiving portion that performs photoelectric conversion of incident light, forming the contacts in accordance with setting for sizes set for the contacts, and forming the electrically conductive wirings.

According to further another embodiment of the present technology, there is provided a semiconductor device including a semiconductor having a circuit element, electrically conductive wirings, and a contact group including contacts that have different sizes and connect the semiconductor and the electrically conductive wirings.

According to an embodiment of the present technology, there is provided an imaging device that includes a semiconductor having a light-receiving portion that performs photoelectric conversion of incident light, electrically conductive wirings, and a contact group including contacts that have different sizes and connect the semiconductor and the electrically conductive wirings.

According to another embodiment of the present technology, there is provided an imaging apparatus that includes an imaging device provided with a semiconductor having a light-receiving portion that performs photoelectric conversion of incident light, electrically conductive wirings, and a contact group including contacts that have different sizes and connect the semiconductor and the electrically conductive wirings, and an image processing section that processes an image of a subject, the image having undergone the photoelectric conversion in the imaging device.

According to yet another embodiment of the present technology, there is provided a production of an imaging device, which includes setting different sizes for contacts that connect a semiconductor and electrically conductive wirings, and forming a light-receiving portion that performs photoelectric conversion of incident light, in the semiconductor, the contacts in accordance with the set sizes; and the electrically conductive wirings.

According to another embodiment of the present technology, there is provided a semiconductor device that includes a semiconductor having a circuit element, electrically conductive wirings, and a contact group including contacts that have different sizes and connect the semiconductor and the electrically conductive wirings.

According to the present technology, an image of a subject can be captured. Specifically, the present technology is capable of providing an appropriate and easy control of a dark signal level.

BRIEF DESCRIPTION OF THE DRAWINGS

FIG. 9A and FIG. 9B are views illustrating an example of contact groups;

FIG. 12 is a flowchart for explaining an example of a production process;

FIG. 13 is a block diagram illustrating a primary structural example of an imaging apparatus and FIG. 14 is a block diagram illustrating a structural example of an imaging apparatus.

DETAILED DESCRIPTION OF THE EMBODIMENT(S)

Figure 1:
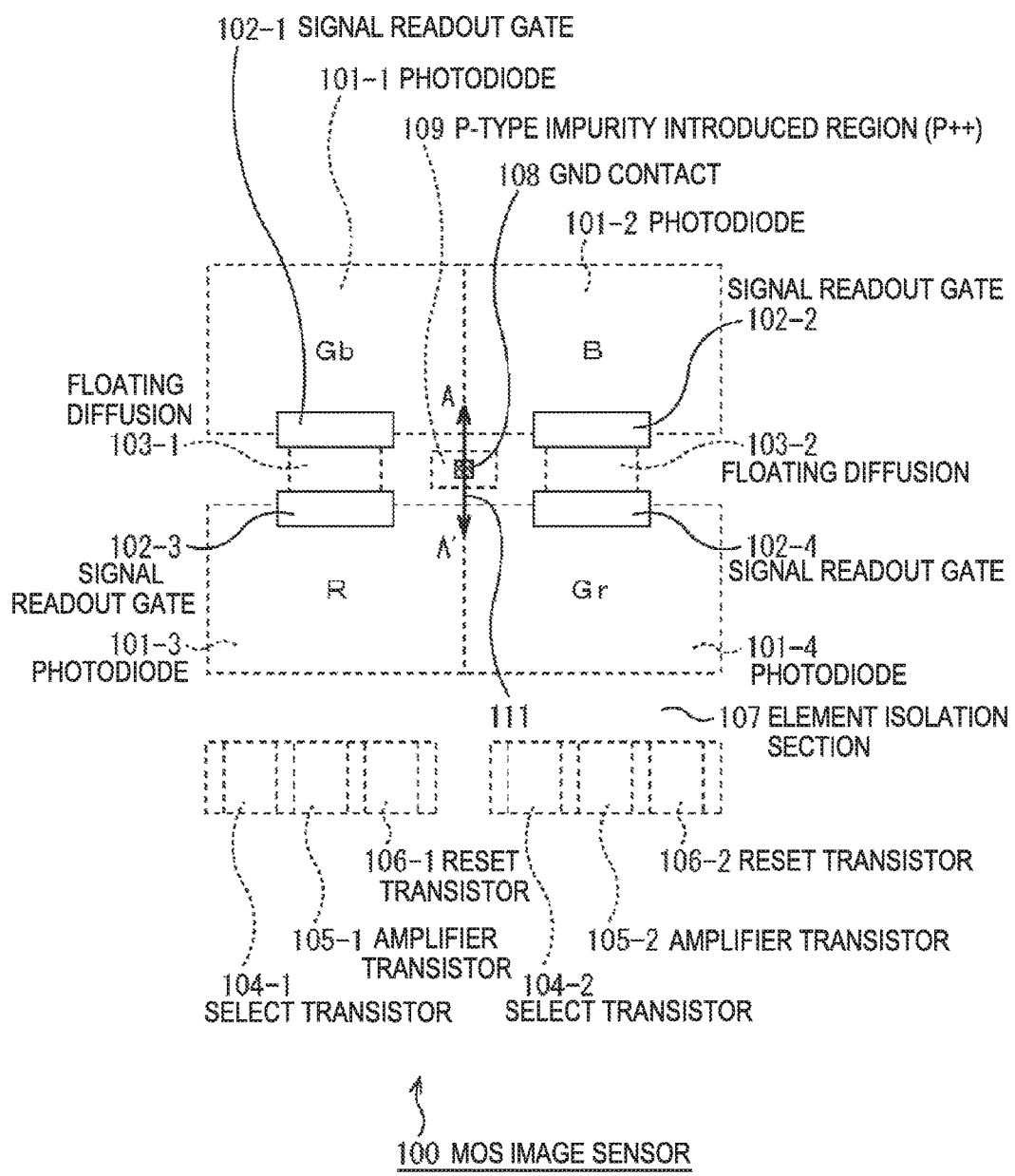
FIG. 1 is a schematic plan view illustrating an example of a primary portion of an MOS image sensor.

Hereinafter, preferred embodiments of the present technology will be described in detail with reference to the appended drawings. Note that, in this specification and the appended drawings, structural elements that have substantially the same function and structure are denoted with the same reference numerals, and repeated explanation of these structural elements is omitted.

The following explanations will be made in the following order.
1. First embodiment (An MOS image sensor)
2. Second embodiment (A production apparatus and method)
3. Third embodiment (An imaging device)

1. First Embodiment

[Structure (Planar Structure) of an MOS Image Sensor]

FIG. 1 is a plan view illustrating a structural example of a primary portion of a Metal Oxide Semiconductor (MOS) image sensor as one embodiment of an imaging device. An MOS image sensor 100 illustrated in FIG. 1 is an image sensor having an MOS, and includes a Complimentary MOS (CMOS) image sensor having a CMOS.

In this structural example of FIG. 1, four pixels in an imaging region of the MOS image sensor are illustrated. For inconvenience of explanation, a structure formed in a silicon (Si) substrate is mainly illustrated, and other elements, which are unnecessary in the following explanations, such as wirings, color filters, and on-chip lenses are omitted.

In FIG. 1, a photodiode (PD) 101-1 serves as a light-receiving portion for a Gb pixel, which performs photoelectric conversion of green light. A photodiode 101-2 serves as a light-receiving portion for a B pixel, which performs photoelectric conversion of blue light. A photodiode 101-3 serves as a light-receiving portion for an R pixel, which performs photoelectric conversion of red light. A photodiode 101-4 serves as a light-receiving portion, which performs photoelectric conversion of green light.

The photodiodes 101-1 through 101-4 may be referred to simply as a photodiode(s) 101 in the following, when it is unnecessary to distinguish each of the photodiodes 101-1 through 101-4.

In FIG. 1, as described above, the photodiodes 101 are illustrated as examples of the light-receiving portions for corresponding pixels. However, any elements may be used as light-receiving portions. For example, photoelectric conversion elements other than a photodiode may be used. Additionally, a structure of the photodiode 101 is arbitrarily determined. For example, although each of the photodiodes 101 has color filters stacked one on another, thereby to detect light with a specific color (a wavelength range), the photodiode 101 is not limited to one having such a structure. Namely, a detecting principle does not matter, as long as the photodiodes 101 are capable of detecting light with corresponding wavelength ranges. Moreover, sizes and shapes of the photodiodes 101 may be arbitrarily determined.

Furthermore, while a so-called Bayer array is illustrated as an example of an array of colors in FIG. 1, an array of colors is not limited to the illustrated one, but may be arbitrarily determined.

A signal readout gate 102-1 is a gate electrode that controls reading out an electric charge stored in the photodiode 101-1. When a readout pulse is applied to the signal readout gate 102-1, the electric charge stored in the photodiode 101-1 is read out to a floating diffusion 103-1. A signal readout gate 102-2 is a gate electrode that controls reading out an electric charge stored in the photodiode 101-2. When a readout pulse is applied to the signal readout gate 102-2, the electric charge stored in the photodiode 101-2 is read out to a floating diffusion 103-2.

A signal readout gate 102-3 is a gate electrode that controls reading out an electric charge stored in the photodiode 101-3. When a readout pulse is applied to the signal readout gate 102-3, the electric charge stored in the photodiode 101-3 is read out to a floating diffusion 103-1. A signal readout gate 102-4 is a gate electrode that controls reading out an electric charge stored in the photodiode 101-4. When a readout pulse is applied to the signal readout gate 102-4, the electric charge stored in the photodiode 301-3 is read out to a floating diffusion 103-2.

The signal readout gates 102-1 through 102-4 may be referred to simply as a signal readout gate(s) 102 in the following, when it is unnecessary to distinguish each of the signal readout gates 102-1 through 102-4.

Electric charge is read out at a different timing from the photodiode 101-1 and the photodiode 101-3 to the floating diffusion 103-1. The floating diffusion 103-1 converts the readout electric charge to a voltage. Similarly, electric charge is read out at a different timing from the photodiode 101-2 and the photodiode 101-4 to the floating diffusion 103-2. The floating diffusion 103-2 converts the readout electric charge to a voltage.

The floating diffusions 103-1 and 103-2 may be referred to simply as a floating diffusion(s) 103 in the following, when it is unnecessary to distinguish each of the floating diffusions 103-1 and 103-2.

A select transistor 104-1 controls output of the voltage of the floating diffusion 103-1. When a select pulse that selects a pixel to be subject to signal readout is applied to a gate electrode of the select transistor 104-1, an amplifier transistor 105-1 is connected to an output signal line (for example, a Vertical Signal Line (VSL)), and thus the voltage of the floating diffusion 103-1 is output. A select transistor 104-2 controls output of the voltage of the floating diffusion 103-2. When a select pulse is applied to a gate electrode of the select transistor 104-2, an amplifier transistor 105-2 is connected to the output signal line, and thus the voltage of the floating diffusion 103-2 is output.

The select transistors 104-1 and 104-2 may be referred to simply as a select transistor(s) 104 in the following, when it is unnecessary to distinguish each of the select transistors 104-1 and 104-2.

The amplifier transistor 105-1 amplifies the voltage output from the floating diffusion 103-1. When the select transistor 104-1 is turned ON and then the amplifier transistor 105-1 is connected to the output signal line, the amplifier transistor 105-1 amplifies the voltage of the floating diffusion 103-1 connected to a gate electrode and outputs the amplified voltage to the output signal line. Similarly, the amplifier transistor 105-2 amplifies the voltage output from the floating diffusion 103-2 and outputs the amplified voltage to the output signal line, under control of the select transistor 104-2.

The voltage output in such a manner is then supplied to, for example, an analog-to-digital (A/D) converter through the output signal line, and digitized to a digital data, which is then output as a pixel data.

The amplifier transistors 105-1 and 105-2 may be referred to simply as an amplifier transistor(s) 105 in the following, when it is unnecessary to distinguish each of the amplifier transistors 105-1 and 105-2.

Upon receiving a reset pulse at a gate electrode, a reset transistor 106-1 resets an electric potential of the floating diffusion 103-1 to a predetermined level. Upon receiving a reset pulse at a gate electrode, a reset transistor 106-2 resets an electric potential of the floating diffusion 103-2 to a predetermined level.

The reset transistors 106-1 and 106-2 may be referred to simply as a reset transistor(s) 106 in the following, when it is unnecessary to distinguish each of the reset transistors 106-1 and 106-2.

As illustrated in FIG. 1, an element isolation portion 107, which is a region provided to prevent unnecessary interactions between elements, is formed between elements, for example, between the photodiode 101-1 and the photodiode 101-3, between the photodiode 101-2 and photodiode 102-4, between the photodiodes 101 and the select transistors 104, between the photodiodes 101 and the amplifier transistors 105, between the photodiodes 101 and the reset transistors 106, and between the reset transistor 106-1 and the select transistor 104-2. The element isolation portion 107 may be formed, for example, by an element isolating method employing selective thermal oxidization of the Si substrate.

In addition, a P-type impurity introduced region (P++) 109 where P-type impurities are implanted at a relatively higher concentration is formed between the photodiode 101-1 (or the photodiode 101-2) and the photodiode 101-3 (or the photodiode 101-4). The P-type impurity introduced region (P++) 109 is isolated from the photodiodes 101, the signal readout gates 102 the floating diffusions 103 and the like by the element isolation portion 107.

In the P-type impurity introduced region (P++) 109, a GND contact 108 (also referred to as a ground contact) is formed to connect a ground (GND) potential wiring (not illustrated) to the Si substrate. Namely, a ground potential as a reference potential is supplied to the Si substrate of a pixel region (a pixel well) through the GND contact 108.

Incidentally, although FIG. 1 illustrates an example where one of the floating diffusions 103, one of the select transistors 104, one of the amplifier transistors 105, and one of the reset transistors 106 are shared by two vertically arranged pixels, a pixel layout is not limited to this example, but may be arbitrarily determined. For example, the floating diffusion 103, the select transistor 104, the amplifier transistor 105, and the reset transistor 106 may be provide for each of the pixels and thus are not shared by the pixels. In contrast, these elements may be shared by four pixels, or more pixels.

[Structure (Cross-Sectional Structure) of an MOS Image Sensor]

Figure 2:
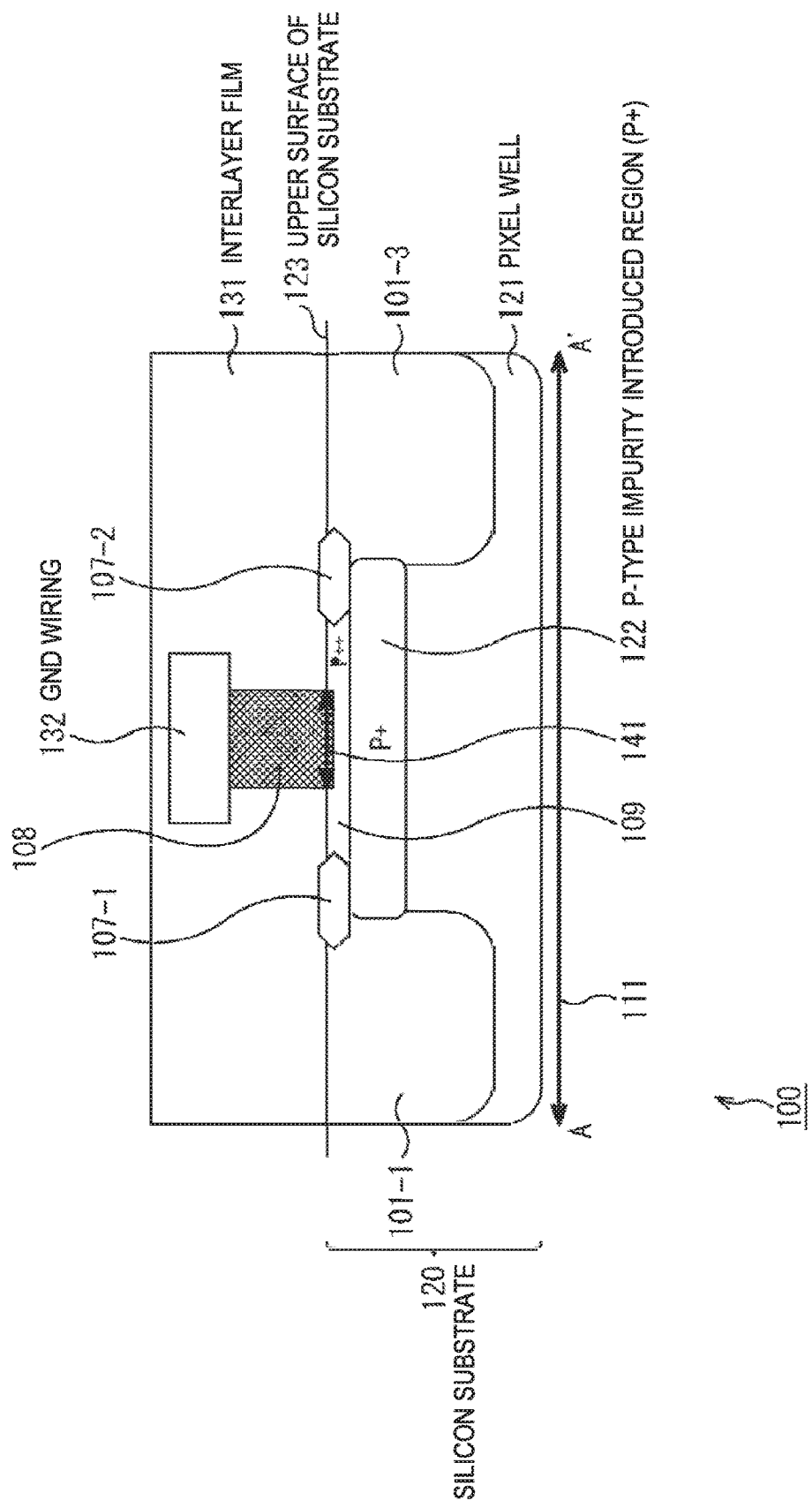
FIG. 2 is a schematic cross-sectional view illustrating an example of the primary portion of the MOS image sensor.

An example of a cross section of the GND contact 108 and its vicinity, which is taken along a double-headed arrow 111 (A-A' line) in FIG. 1, is illustrated in FIG. 2.

Referring to FIG. 2, the photodiode 101, the P-type impurity introduced region (P++) 109, the element isolation portion 107, and the like are formed in an area closer to an upper surface 123 within a pixel well 121 formed in a Si substrate 120. Incidentally, in FIG. 2, which is a cross-sectional view, the element isolation portion 107 is illustrated in such a manner that the portion 107 is divided into an element isolation portion 107-1 and an element isolation portion 107-2. In addition, a P-type impurity introduced region (P+) 122 is formed in a deeper area of the Si substrate 120 in relation to the P-type impurity introduced region (P++) 109, or below the P-type impurity introduced region (P++) 109. The P-type impurity introduced region (P+) 122 contains P-type impurities at a lower concentration than the P-type impurity introduced region (P++) 109.

The GND contact 108 is formed on the upper side of the P-type impurity introduced region (P++) 109 in the upper surface 123 of the Si substrate, and connects a GND wiring 132 at the ground potential and the P-type impurity introduced region (P++) 109. Namely, the reference potential (ground potential) is supplied to the pixel well 121 from the GND wiring 132 through the GND contact 108, the P-type impurity introduced region (P++) 109, and the P-type impurity introduced region (P+) 122. The GND wiring 132 is formed of, for example, a metal such as aluminum and copper. An interlayer film 131 is formed in a portion except for contacts and wirings of a wiring layer.

[Electric Charge Flow-In]

Figure 3:
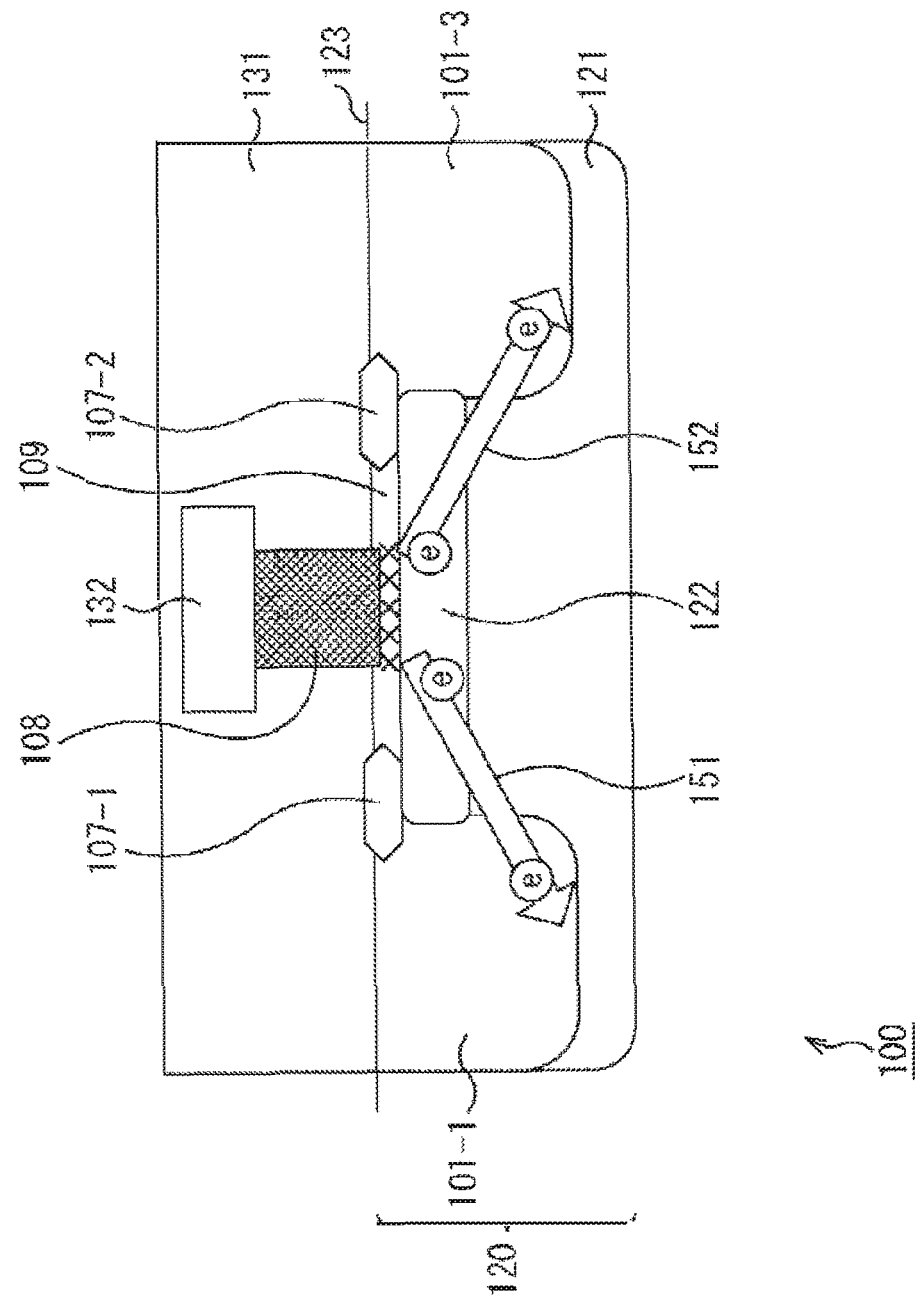
FIG. 3 is another schematic cross-sectional view illustrating an example of the primary portion of the MOS image sensor.

Incidentally, when the GND contact 108 is formed, the interlayer film 131 is formed by an etching method or the like, thereby to obtain a contact hole. Due to etching damage caused at this time, defect levels are generated within the Si substrate 120 and serve as a generation source of a dark electric current. As illustrated in FIG. 3, parts of the generated dark electric current components (electrons) flow into the photodiode 101 as indicated by arrows 151, 152, which may be a factor to change an amount of the dark electric current in each pixel.

In other words, variations of the dark electric current in each pixel depend on an amount of the dark electric current (electrons) that flow into the photodiode 101, i.e., the number of the defect levels generated at the time of forming the contact hole. Therefore, an amount of the dark electric current in each pixel can be controlled by controlling a degree of etching damage, or a size of the contact hole.

Here, a size of the contact hole means, for example, an area of the contact hole in the upper surface 123 of the Si substrate 120. Additionally, a size of the contact hole includes indexes having substantially the same meaning of the area, such as a diameter of the contact hole (a contact hole diameter). Moreover, because the GND contact 108 is formed in the contact hole, the GND contact 108 has substantially the same size as the contact hole. Therefore, a size of the GND contact 108 here is the same as the size of the contact hole in which the GND contact 108 is formed.

Namely, a size of the GND contact 108 indicates an area of the GND contact 108 in the upper surface 123 of the Si substrate 120, specifically a contact area of the GND contact 108 to the P-type impurity introduced region (P++) 109. Therefore, a size of the GND contact 108 includes indexes having substantially the same meaning as the area of the GND contact 108, such as a diameter (contact diameter) of the GND contact 108. Incidentally; a shape of the contact area of the GND contact 108 to the P-type impurity introduced region (P++) 109 is arbitrarily determined. For example, the shape of the contact area may be a substantial rectangular, a substantial round corner rectangle, a substantial circle, or the like. Therefore, a diameter (a contact diameter) of the GND contact 108 has substantially the same meaning as the area thereof. Namely, an amount of the dark electric current in each pixel depends on a length of the GND contact 108 along a direction in which the upper surface 123 extends, as indicated by a double-headed arrow 141 in FIG. 2.

[Relationship between Contact Diameter and an Amount of the Dark Electric Current]

Figure 4:
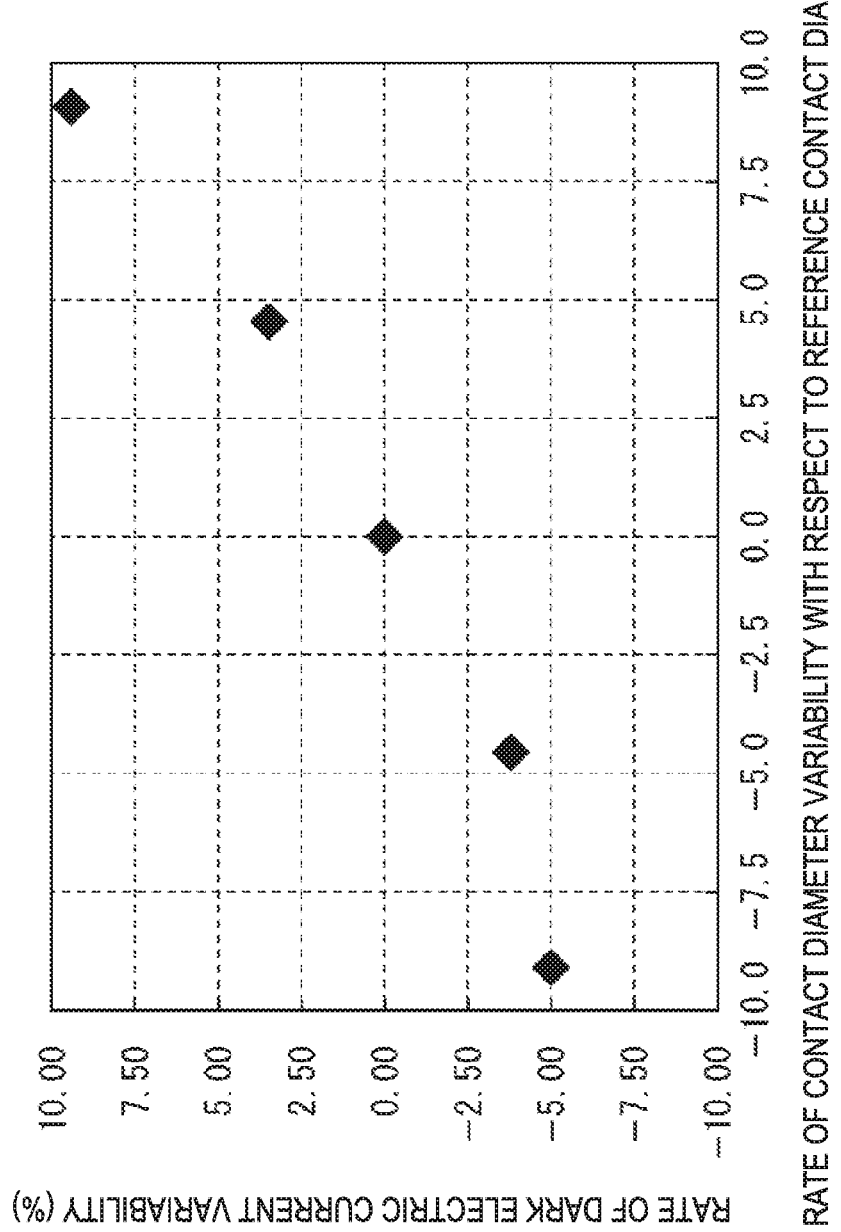
FIG. 4 is an explanatory view for explaining a relationship between a variability rate of a contact diameter and a variability rate of a dark electric current.

FIG. 4 illustrates a relationship between a variability rate of the contact diameter and a variability rate of the dark electric current. A graph of FIG. 4 illustrates a variability rate of the dark electric current obtained by increasing or decreasing the contact diameter with respect to a contact diameter serving as reference. As illustrated, the amount of the dark electric current is increased as the contact diameter is increased; and the amount of the dark electric current is decreased as the contact diameter is decreased.

Incidentally, a size of the contact diameter (a reference value) may be arbitrarily determined. When the contact diameter is changed by a degree of 10 mm through 20 mm or around, for example, the dark electric current is changed by a degree of several % or around.

[Dark Electric Current Control]

As described above, by deliberately controlling a size of the GND contact 108 (for example, the contact diameter (the length indicated by the double-headed arrow 141 of FIG. 2)), thereby to form a plurality of the GND contacts 108 having different sizes in the MOS image sensor, the dark electric current can be controlled. For example, when the size of the GND contact 108 is made as small as possible, the dark electric current is suppressed from increasing.

Such control of a contact size scarcely places an influence on a gain of various transistors, and scarcely serves as a cause for gain variability. In addition, the control of a contact size scarcely places an influence on conversion efficiency, a readout voltage, a saturation signal amount, sensitivity, or the like, and scarcely serves as a cause for variations in the image capturing characteristics at the time of a bright state. Moreover, the control of a contact size scarcely serves as a cause for generation of white points or dark electric current, and a cause for degrading saturation or sensitivity characteristics or the like. Furthermore, the control of a contact size scarcely serves as a cause for an increased chip size, an increased number of processes, necessities for special processes, an increased amount of memory, a degraded production yield, an increased production cost, or the like. Additionally, the control of a contact size eliminates the necessity of a process for pixel signal correction, and scarcely serves as a cause for degraded image quality.

As stated above, the control of the dark electric current through the control of a contact size makes it possible to appropriately and easily control a dark electric current level.

In other words, the above-stated control of a contact size makes it possible to reduce not only an amount of the dark electric current but also a variability of the dark electric currents between pixels. Namely, by deliberately controlling a size of the GND contact 108 (for example, a contact diameter (the length indicated by the double-headed arrow 141)), the dark electric current in each pixel can be increased or decreased. Therefore, a plurality of the GND contacts 108 having different sizes are formed in the MOS image sensor 100 so that a variability of the dark electric currents between pixels can be suppressed. In such a manner, a variability of the dark electric currents between pixels is suppressed, so that the MOS image sensor 100 can provide high quality images.

For example, by deliberately controlling sizes of the GND contacts 108, the GND contacts 108 can have different sizes from the other contacts (i.e., contacts other than the GND contacts 108) that exist within a pixel region of the MOS image sensor 100.

[Other Contacts]

Figure 5:
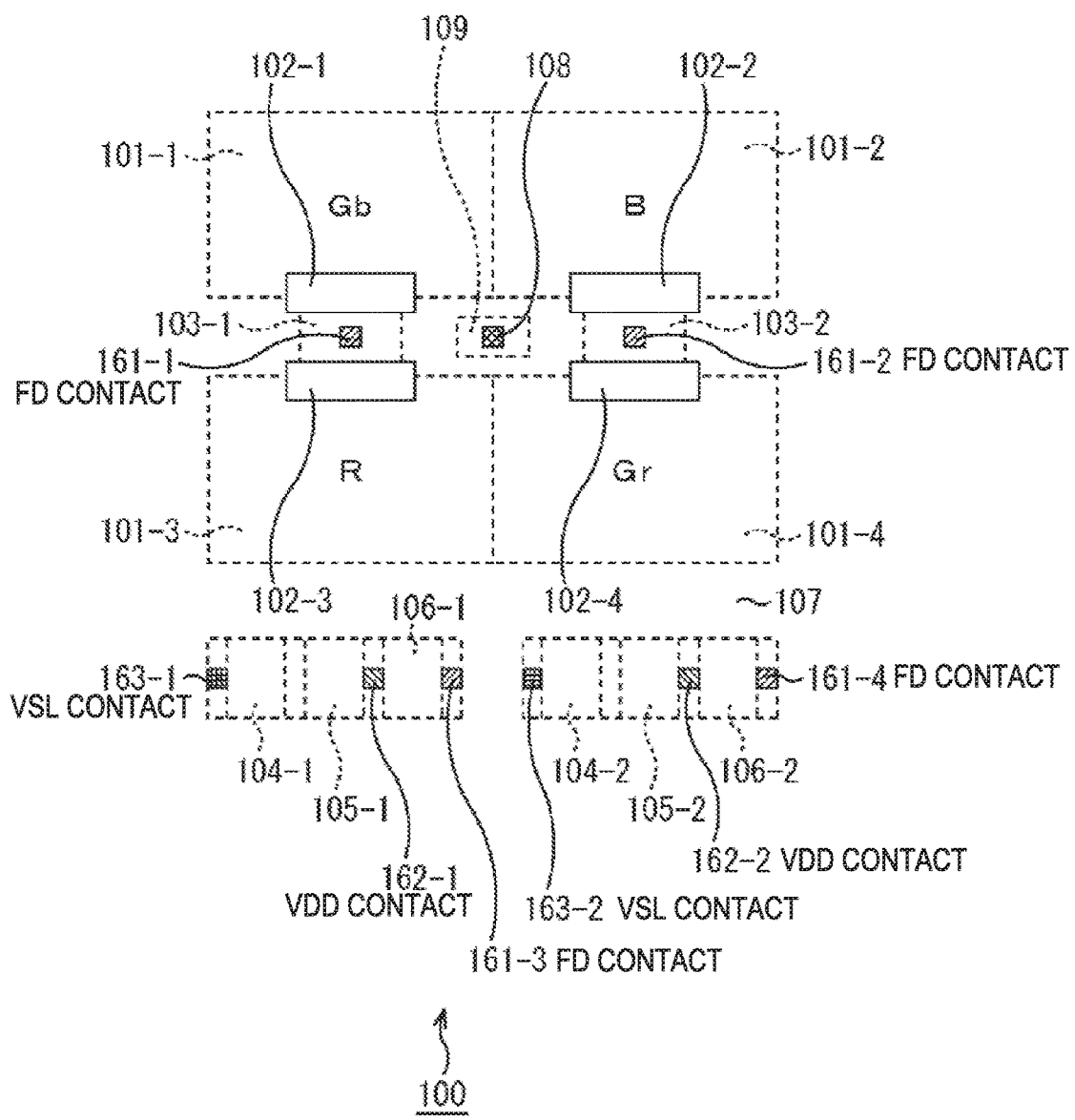
FIG. 5 is another schematic plan view illustrating an example of the primary portion of the MOS image sensor.

In the pixel region of the MOS image sensor 100, not only the GND contacts 108 but also the other contacts are formed, as illustrated in FIG. 5.

An FD contact 161-1 connects the floating diffusion 103-1 and a wiring (not illustrated) that connects the floating diffusion 103-1 and the reset transistor 106-1. An FD contact 161-2 connects the floating diffusion 103-2 and a wiring (not illustrated) that connects the floating diffusion 103-2 and the reset transistor 106-2.

An FD contact 161-3 connects the reset transistor 106-1 and a wiring (not illustrated) that connects the floating diffusion 103-1 and the reset transistor 106-1. An FD contact 161-4 connects the reset transistor 106-2 and a wiring (not illustrated) that connects the floating diffusion 103-2 and the reset transistor 106-2.

The FD contacts 161-1 through 161-4 may be referred to simply as an ED contact(s) 161 in the following, when it is unnecessary to distinguish each of the FD contacts 161-1 through 161-4.

A VDD contact 162-1 connects a wiring (not illustrated) of a power source potential (VDD) to the amplifier transistor 105-1 and the reset transistor 106-1. A VDD contact 162-2 connects a wiring (not illustrated) of the power source potential (VDD) to the amplifier transistor 105-2 and the reset transistor 106-2.

The VDD contacts 162-1 and 162-2 may be referred to simply as a VDD contact(s) 162 in the following, when it is unnecessary to distinguish each of the VDD contacts 162-1 and 162-2.

A VSL contact 163-1 connects the select transistor 104-1 and the output signal line (not illustrated). A VSL contact 163-2 connects the select transistor 104-2 and the output signal line (not illustrated).

The VSL contacts 163-1 and 163-2 may be referred to simply as a VSL contact(s) 163 in the following, when it is unnecessary to distinguish each of the VSL contacts 163-1 and 163-2.

Figure 6:
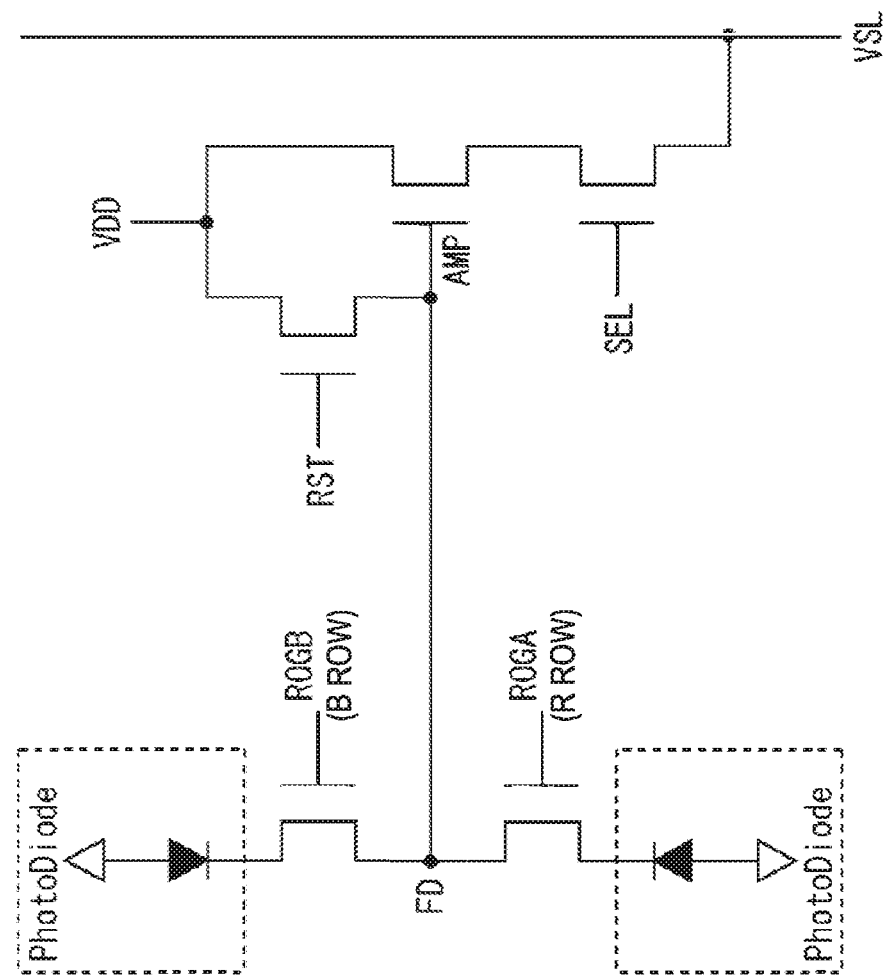
FIG. 6 is a view illustrating an example of a configuration of a pixel.

Namely, a circuit from the photodiode 101 to the output signal line is formed within a pixel, as illustrated in FIG. 6, and the various contacts stated above are formed between the Si substrate 120 and the wirings connected to the corresponding elements.

Figure 7:
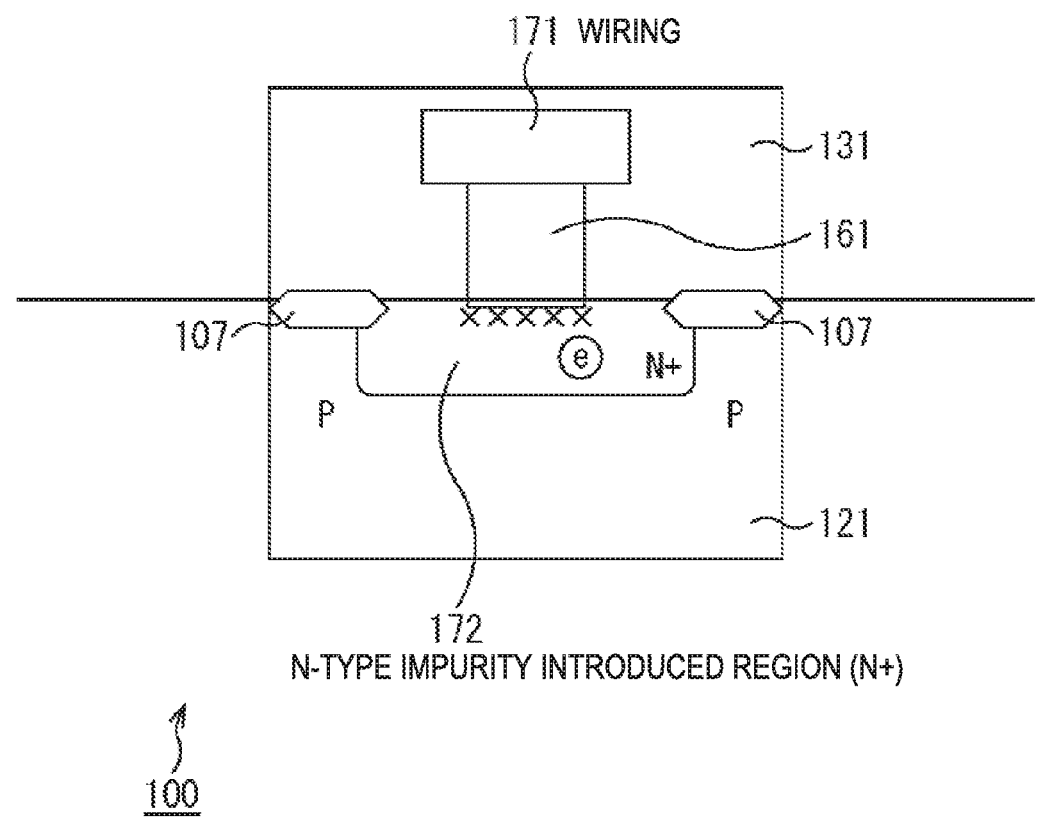
FIG. 7 is another schematic cross-sectional view illustrating an example of the primary portion of the MOS image sensor.

However, the contacts (other than the GND contacts 18) such as the FD contacts 161, the VDD contacts 162, and the VSL contacts 163 connect a wiring 171 (FIG. 7) of a potential other than the ground potential (at a potential different from the potential of the GND wiring 132) to the upper surface 123 (FIG. 2) of the Si substrate 120. Regarding such contacts, as illustrated in a cross-sectional view of FIG. 7, an N-type impurity introduced region (N+) 172 to which N-type impurities are introduced (implanted) is formed in the pixel well 121 below the contacts concerned.

Figure 8A:
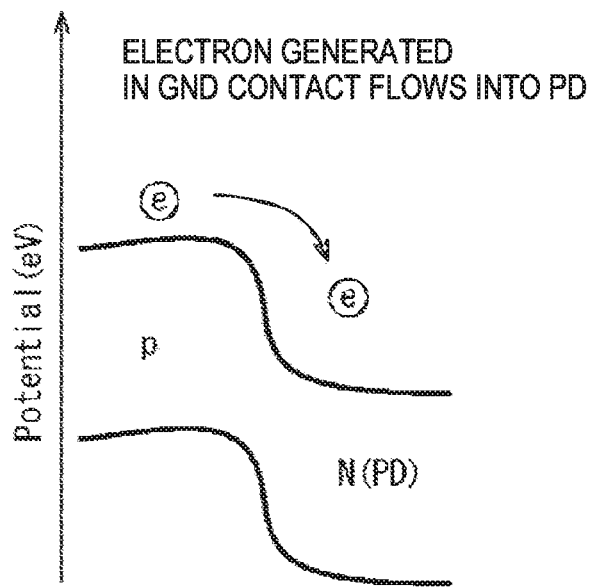
FIG. 8A and FIG. 8B are energy band diagrams for explaining an example of electric charge movement.
Figure 8B:
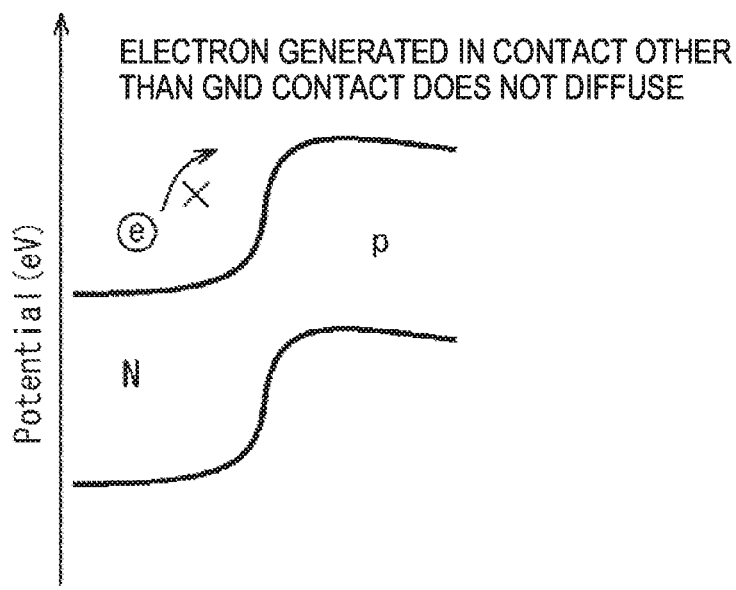

Namely, whereas an energy band diagram in the vicinity of the GND contacts 108 is as illustrated in FIG. 8A, an energy band diagram in the vicinity of the other contacts is as illustrated in FIG. 8B. Therefore, whereas electrons generated in the GND contact 108 flow into the photodiode 101, electron generated in the other contacts do not diffuse.

[Size Control of the Contacts Other than GND Contacts]

Therefore, it is unnecessary to control sizes of the other contacts in order to control the dark electric current. In other words, in order to control the dark electric current, it is only the GND contacts 108 that are subject to the size control. Namely, a size of the GND contact 108 may be designed, independent of a size of the other contacts, for example.

As a result of designing in such a manner, sizes of the GND contacts 108 and sizes of the other contacts (for example, the FD contact 161, the VDD contact 162, or the VSL contact 163) may be different from each other.

More specifically, the other contacts may have a first size, and the GND contact 108 may have a second size that is different from the first size. The second size may be larger or smaller than the first size, depending on a target value or the like of an amount of the dark electric current.

In addition, because it is unnecessary to control sizes of the other contacts, while the other contacts may uniformly have a predetermined size (for example, the first size), the GND contacts 108 may be individually controlled, depending on an amount of the dark electric current, thereby to have different sizes.

On the contrary, the other contacts may be formed to have different sizes. Even in this case, the GND contacts 108 may uniformly have a predetermined size, depending on an amount of the dark electric current, or may be individually controlled, thereby to have different sizes.

[Size Control of the GND Contact]

As described above, the GND contact 108 may be formed to have different sizes so that a variability of the dark electric current is controlled.

[Size Control of the GND Contact in an OPB Pixel Region]

For example, the MOS image sensor 100 has an Optical Black (OPB) pixel region in a periphery of the effective pixel region as a pixel region, as illustrated in FIG. 9A.

Generally, there is a noise component called a dark electric current that is thermally generated even when light is not incident onto a photodiode in a solid imaging device. The dark electric current is increased or decreased, depending mainly on a temperature. To deal with this, the OPB pixel region for dark electric current correction is provided in the vicinity of an imaging region that effectively captures an image, and a signal voltage taken out from a pixel portion of the OPB pixel region is utilized as a reference voltage for determining a black level. Then, the reference voltage is subtracted from a signal voltage taken out from a pixel in the effective pixel region of the imaging region, and thus a direct current component of the dark electric current is removed.

A structure of a pixel in the OPB pixel region is basically the same as that of the pixel in the effective pixel region. However, the pixel in the OPB pixel region is provided with a light shielding film that shields light to be incident onto the pixel. Namely, in the OPB pixel region, the signal voltage is taken out from the pixel under a light-shielding condition. The signal voltage from the pixel in the OPB pixel region equals in fact the reference voltage (the ground potential), and extracted as a black level.

Because the configuration of the pixel in the OPB pixel region is basically the same as that of the pixel in the effective pixel region, except for the light shielding film, the black level generated at the pixel in the OPB pixel region is also generated at the pixel in the effective pixel region. Therefore, by subtracting the reference voltage determining the black level from the signal voltage taken out from the pixel in the effective pixel region of the imaging region, a direct current component of unnecessary dark electric current can be removed.

However, in a solid imaging device used widely, the dark electric currents generated in the OPB pixel region and in the imaging region under the light shielding condition may disagree with each other, as illustrated in FIG. 9A, even at the same temperature, so that a level difference (referred to as an OPB level difference, hereinafter) is disadvantageously caused between the regions. The OPB level difference is primarily caused by the light shielding film. Namely, an entire area of the OPB pixel region, including the pixel portion, is covered with the light shielding film, whereas a light incident path is present in the pixel in the imaging region thereby to allow light to be incident on the pixel, and the light shielding film is absent in the light incident path. In an annealing process performed in order to reduce the dark electric current during a production of a solid state imaging device, because the light shielding film containing hydrogen is formed over the entire area of the OPB pixel region, hydrogen diffusion takes place to a larger degree in the OPB pixel region than in the effective pixel region. This raises a concern that surface levels are significantly lowered, and thus a concern of generating the OPB level difference where the dark electric currents at the pixels become greater in the OPB pixel region than in the effective pixel region, as indicated by a line 201 of FIG. 9A.

Under such circumstances, the dark electric current generated at the pixel in the OPB pixel region may be controlled by deliberately controlling a size of the GND contact 108 (for example, the contact diameter (the length of the double-headed arrow 141 in FIG. 2)). In other words, sizes of the GND contacts 108 in the effective pixel region and the OPB pixel region are controlled so that a difference (variations) of the dark electric currents in the pixels between the regions may be suppressed, as illustrated in FIG. 9B.

For example, as illustrated in FIG. 99, the GND contacts 108 in the OPB pixel region may have the first size, and the GND contacts 108 in the effective pixel region may have the second size different from the first size. The second size may be larger or smaller than the first size, depending on a target value or the like of the dark electric current.

In such a manner, the MOS image sensor 100 is capable of suppressing (preventing, or reducing, if happens) the OPB level difference.

Moreover, sizes of the GND contacts 108 in the OPB pixel region may be individually controlled, depending on the dark electric currents generated in each of the pixels, thereby to form the GND contacts 108 having different sizes. With this, variations of the dark electric current can be suppressed between the pixels in the OPB pixel region.

In this case, the GND contacts 108 in all the pixels in the effective pixel region may have an identical size or different sizes. Namely, the GND contacts 108 in the effective pixel region may have different sizes.

In fact, by forming at least one of the GND contacts 108 in the OPB pixel region so that the size thereof is different from a size of at least one of the GND contacts 108 in the effective pixel region, the OPB level difference can be suppressed from being generated, circumventing degradation of an image quality at the time of the bright state, and without the necessities of additional production processes or signal processes, and of an increased chip size. Namely, the image quality only at the time of a dark state can be appropriately and easily improved. Therefore, the MOS image sensor 100 can provide higher quality images.

[Size Control of the GND Contacts in the Entire Effective Pixel Region]

Figure 10:
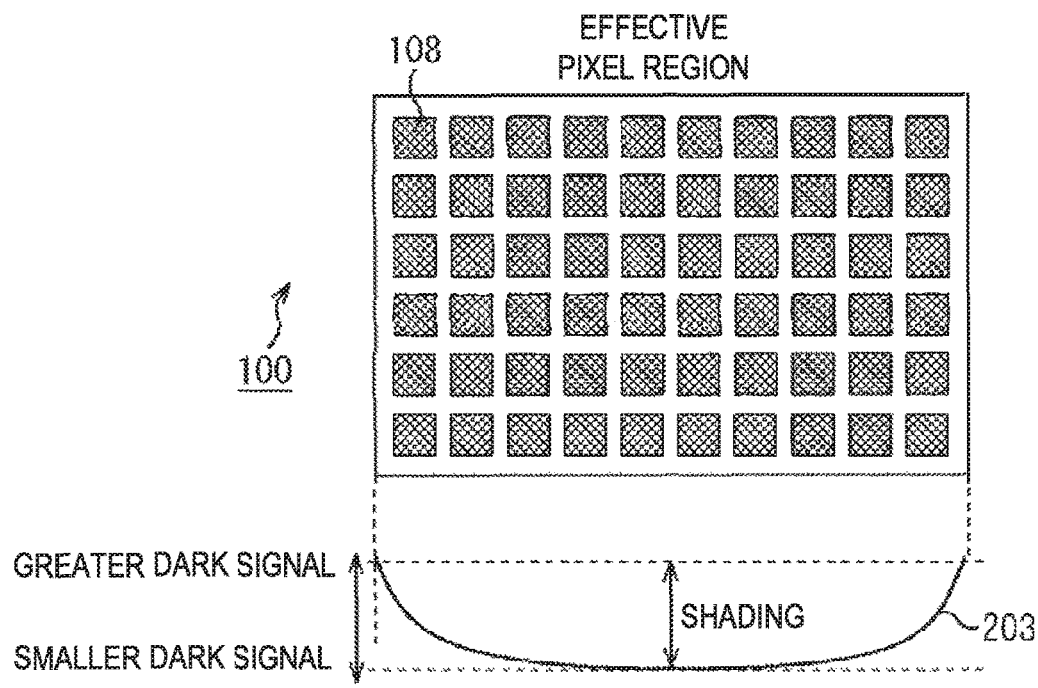
FIG. 10A and FIG. 10B are views illustrating an example of contact groups.

In the effective pixel region of an imaging device, variations of the dark electric currents (the dark signal shading) are often caused. For example, hot carriers are likely to be injected from a peripheral circuit to the pixel in the effective pixel region. In addition, a physical layer thickness in a center portion and a peripheral portion of the effective pixel region is likely to be different from each other. Such a difference causes dark signal level variations, and thus the dark signal shading may take place as indicated by a curved line 203 of FIG. 10A. The curved line 203 indicates an example of a horizontal dark signal shading that takes place in a horizontal direction in the drawing. In fact, the dark signal shading may take place not only in the horizontal direction but also in any directions.

In order to suppress such a dark signal shading that may take place throughout the entire area of the effective pixel region, the GND contacts 108 having different sizes may preferably be formed by deliberately controlling sizes of the GND contacts 108 in the effective pixel region. For example, the GND contacts 108 having different sizes may be arranged in a predetermined pattern in the entire area of the effective pixel region so that the dark signal shading can be suppressed.

For example, a predetermined function may be set that creates an association between a position and a size of the GND contact 108 positioned therein. With this, each of the GND contacts 108 would have a particular size determined by a position in which the GND contact 108 should be formed, in accordance with the function.

In addition, the GND contacts 108 positioned closer to an edge of the effective pixel region may have a larger size(s), in relation to the GND contacts 108 positioned in a center area of the effective pixel region. On the contrary, the GND contacts 108 positioned closer to the edge of the effective pixel region may have a smaller size(s). For example, each of the GND contacts 108 may be formed so that the GND contact 108 has a size determined depending on an image height.

Figure 10B:
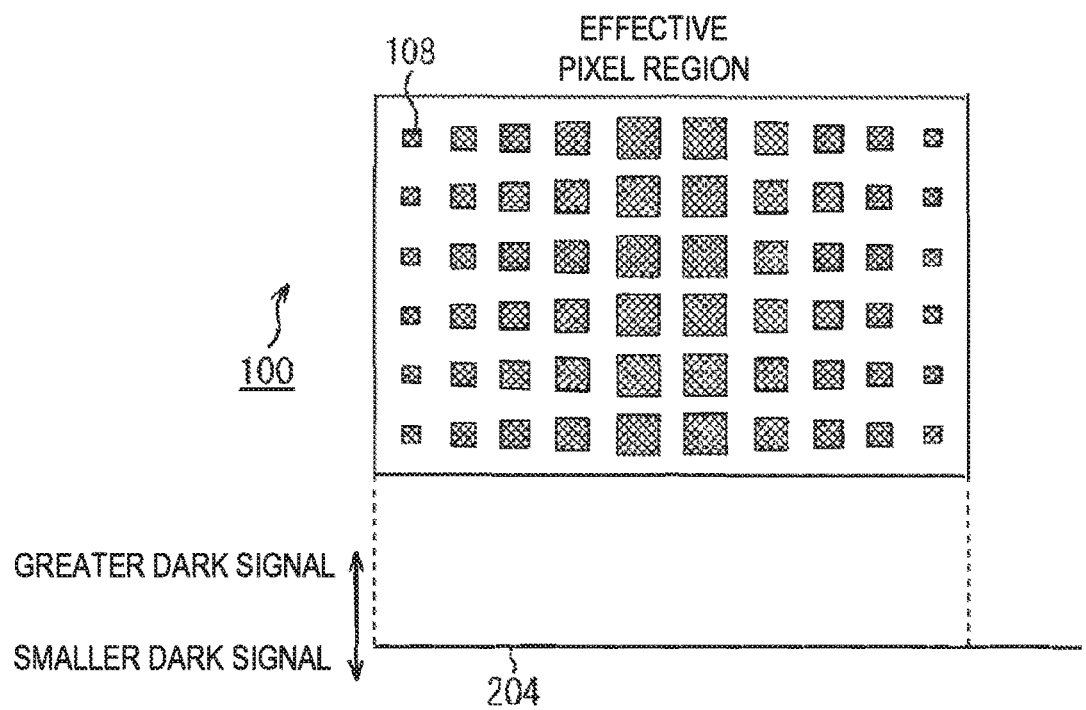

Moreover, as illustrated in FIG. 10B, sizes of the GND contacts 108 may become smaller toward the edges of the effective pixel region in the horizontal direction (or toward right-hand and left-hand sides of the effective pixel region). With this, the horizontal dark signal shading, which takes place in the example of FIG. 10A, can be suppressed as indicated by a straight line 204 of FIG. 109.

As described above, by controlling sizes of the GND contacts 108 in the effective pixel region, the dark signal shading can be suppressed, circumventing degradation of an image quality at the time of the bright state, and without the necessities of additional production processes or signal processes, and of an increased chip size. Namely, the image quality only at the time of a dark state can be appropriately and easily improved. Therefore, the MOS image sensor 100 can provide higher quality images.

[Local Size Control of the GND Contacts in the Effective Pixel Region]

Naturally, sizes of the GND contacts 108 may be controlled locally rather than entirely in the effective pixel region. Namely, part of the GND contacts 108 in the effective pixel region may have a different size than another part of the GND contacts 108 in the effective pixel region.

For example, dark electric currents may be generated from any of vertical line defects, horizontal line defects (see, straight lines 205-1 and 205-2 of FIG. 11A, for example), and point defects, which may be routinely caused in the pixel region from the restrictions of production processes or operational specifications.

When addresses of such routinely caused defects are known, the dark electric current from the defects can be corrected by differentiating sizes of the GND contacts 108 depending on a difference in the dark signal level, which may be caused only around the addresses of the defects.

Figure 11A:
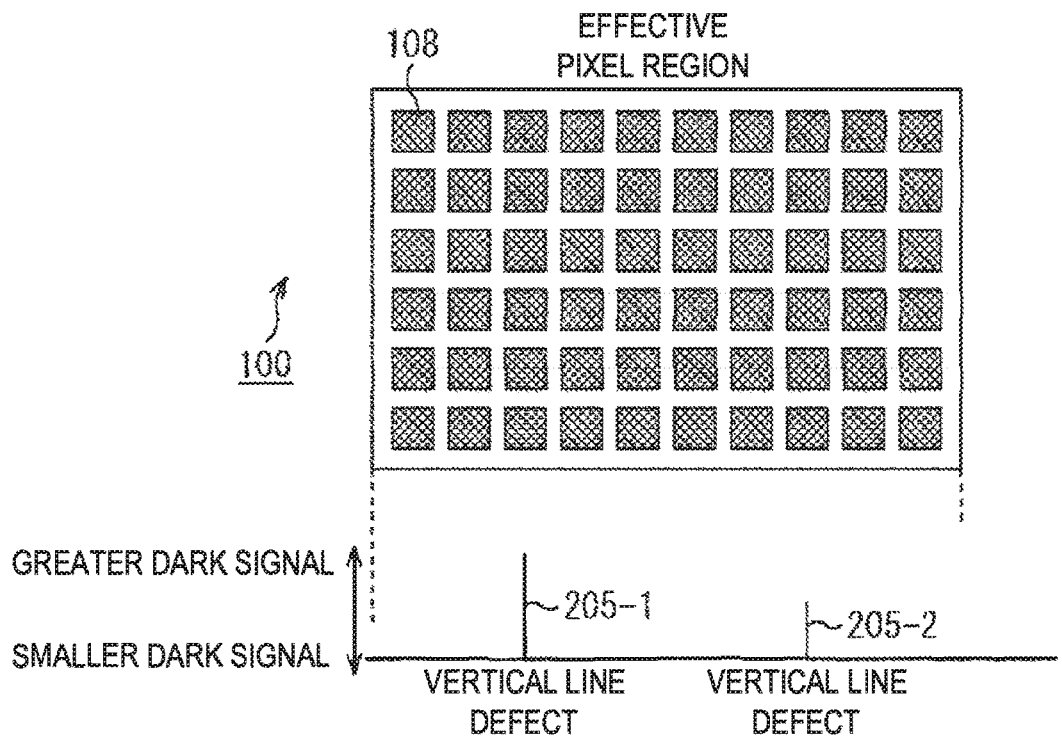
FIG. 11A is yet another view illustrating an example of contact groups.
Figure 11B:
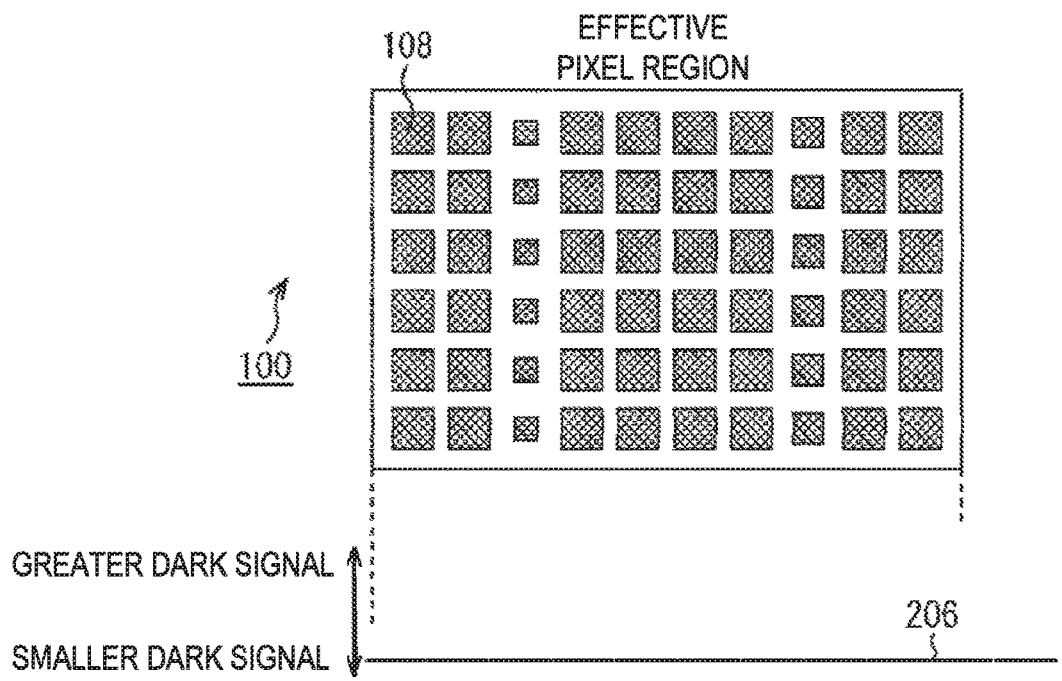
FIG. 11B is a block diagram illustrating a primary structural example of a production apparatus.

Specifically, when the dark electric current from the vertical line defect is routinely generated at the time of the dark state as illustrated in FIG. 11A, sizes of the GND contacts 108 only in the addresses (or a column) where the defects exist are deliberately controlled in accordance with a difference in the dark electric current in an area surrounding the column and to be different from those of the GND contacts 108 positioned in the area surrounding the column. With this, the locally generated dark signal level anomaly, which is as illustrated in FIG. 11A, can be suppressed (prevented, or reduced, if caused), as indicated by a straight line 206 of FIG. 11B.

Naturally, the local size-control of the GND contacts 108 in the effective pixel region can be performed with respect to an arbitrary number of the GND contacts 108 as a unit. Namely, each of the GND contacts 108 may be independently subject to the size control, or plural units of the GND contacts 108 may be independently subject to the size control.

For example, regarding the GND contacts 108 arranged in a matrix as illustrated in FIG. 11, sizes of the GND contacts 108 in a particular column or every plural columns may be controlled. Alternatively, sizes of the GND contacts 108 in a particular row or every plural rows may be controlled. Naturally, sizes of the GND contacts 108 arranged along an oblique direction may be controlled.

In addition, sizes of the GND contacts 108 within a predetermined area or a block, which does not cover an entire row or an entire column, may be controlled, for example. Moreover, a group of the GND contacts 108 that are separately positioned (or not positioned adjacently), as a unit, may be subject to the size control.

As above, by controlling sizes of the GND contacts 108 in the effective pixel region, the local dark signal level anomaly can be suppressed, circumventing degradation of an image quality at the time of the bright state, and without the necessities of additional production processes or signal processes, and of an increased chip size. Namely, the image quality only at the time of a dark state can be appropriately and easily improved. Therefore, the MOS image sensor 100 can provide higher quality images.

Incidentally, the MOS image sensor 100 may be an image sensor of a top surface illuminated type that performs a photoelectric conversion of light incident onto a surface on the side of a wiring layer of the Si substrate, or an image sensor of a bottom surface illuminated type that performs a photoelectric conversion of light incident onto a surface opposite to the surface on the side of the wiring layer of the Si substrate.

In addition, this technology is applicable to an arbitrary image sensor other than the MOS image sensor. For example, this technology is applicable to an image sensor utilizing a Charge Coupled Device (CCD). Moreover, this technology is applicable to an image sensor of lamination type obtained by stacking a silicon substrate in which peripheral circuits and the like are formed and another silicon substrate in which a device with a pixel region is formed. In this case, a size of a contact may be controlled in the silicon substrate having the peripheral circuits and the like, rather than the device with the pixel region. Namely, this technology may be applied in order to control an amount of the dark electric current in other semiconductor substrates.

2. Second Embodiment

[Production]

FIG. 12 is a block diagram illustrating a structural example of a production apparatus according to another embodiment of the present technology. A production apparatus 300 illustrated in FIG. 12 is preferably used to produce the MOS image sensor 100, and provided with a controlling section 301 and a producing section 302.

The controlling section 301 has a Central Processing Unit (CPU), a Read Only Memory (ROM), a Random Access Memory (RAM), and the like, for example, and controls each section of the producing section 302. For example, the CPU of the controlling section 301 performs various processes in accordance with programs stored in the ROM. In addition, the CPU performs various processes in accordance with programs loaded from a memory section 313 to the RAM. The RAM arbitrarily stores data necessary for the CPU to perform various processes.

The producing section 302 is controlled by the controlling section 301 thereby to perform processes regarding production of the MOS image sensor 100. The producing section 302 has a semiconductor substrate structure creating section 331, an interlayer film forming section 332, a contact forming section 333, a wiring forming section 334, a filter forming section 335, and a collective lens forming section 336. These sections 331 through 336 are controlled by the controlling section 301 thereby to perform various processes in corresponding process steps for producing the image device, as described below.

Incidentally, process steps only regarding this technology are explained here, for the sake of explanation. In reality, in order to produce the MOS image sensor 100, other process steps other than the process steps performed by the above-mentioned sections are naturally necessary, and thus the producing section 302 has processing sections for the other process steps. However, detailed explanations about the other process steps are omitted here.

The production apparatus 300 has an input section 311, an output section 312, a memory section 313, a communicating section 314, and a drive 315.

The input section 311 includes a keyboard, a mouse, a touch panel, an input terminal, and the like. The input section 311 receives user instructions and information from the outside, and provides them to the controlling section 301. The output section 312 includes a display device such as a Cathode Ray Tube (CRT) display and a Liquid Crystal Display (LCD) panel, a speaker, an output terminal, and the like, and outputs various types of information supplied from the controlling section 301 as an image, a sound, an analog signal, or a digital data.

The memory section 313 includes a flash memory such as an SSD, a hard disk, and the like, and stores information supplied from the controlling section 301 or reads out and supplies stored information in accordance with a request from the controlling section 301.

The communicating section 314 includes, for example, an interface or a modem of a Local Area Network (LAN) or a wireless LAN, and the like, and communicates with an outside apparatus through a network including the internet. For example, the communicating section 314 transmits information supplied from the controlling section 301 to a destination apparatus, and supplied information received from the destination apparatus to the controlling section 301.

The drive 315 is connected to the controlling section 301, when necessary. A removal medium 321 such as a magnetic disk, an optical disk, a magnetic optical disk, a semiconductor memory, and the like are appropriately loaded into the drive 315. A computer program read out from the removable medium 321 through the drive 315 is installed to the memory section 313, when necessary.

Figure 13:
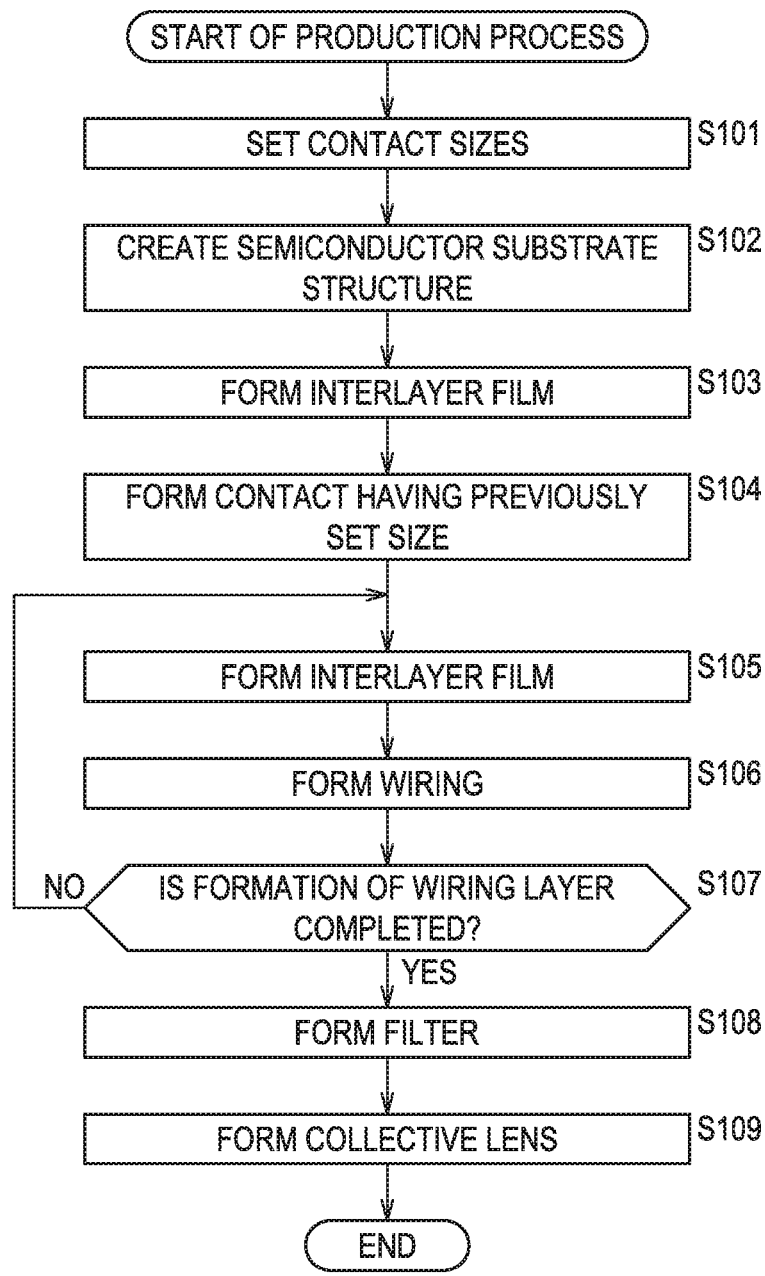

An example of a production flow is explained with reference to a flowchart of FIG. 13.

Once production is started, the controlling section 301 sets a size of the contact (at least one of the GND contacts 108) depending on an amount of the dark electric current, in Step S101. In this case, the controlling section 301 sets a size of the contact so that an amount of the dark electric current is suppressed or variations of an amount of the dark electric current between pixels are suppressed.

For example, the controlling section 301 controls a size of the GND contact 108, as described in the first embodiment. More specifically, the controlling section 301 sets, for example, sizes of the GND contacts 108 in the effective pixel region and the OPB pixel region, depending on a difference between the dark signal levels in the effective pixel region and in the OPB pixel region. In addition, the controlling section 301 sets, for example, sizes of the GND contacts 108 in the effective pixel region, depending on variations of the dark signal levels due to positions of the GND contacts 108 in the effective pixel region. Moreover, the controlling section 301 sets, for example, a size of the GND contact 108 of an abnormal pixel, depending on a difference between the dark signal levels in a normal pixel and in the abnormal pixel. Naturally, without being limited to these examples, the controlling section 301 can control a size of the contact thereby to control an amount of the dark electric signal, depending on arbitrary information.

In Step S102, the semiconductor substrate structure creating section 331 creates a structure such as the photodiodes 101, the signal readout gates 102, the floating diffusions 103, various transistors, the element isolation portions 107, the impurity introduced regions, and the like in the Si substrate 120.

In Step S103, the interlayer film forming section 332 forms the interlayer film 131 on the upper surface 123 of the Si substrate 120.

In Step S104, the contact forming section 333 forms the contact having the size set in Step S101 in a predetermined position of the interlayer film 131. Any methods of forming the contact may be employed.

For example, the contact forming section 333 forms performs a predetermined treatment such as etching thereby to form a contact hole in the interlayer film 131, and thus forms the contact in the contact hole. Specifically, the contact forming section 333 forms the GND contact 108 having the size set in Step S101. Namely, the contact forming section 333 forms the contact hole for forming the GND contact 108 at a size identical to the size set in Step S101, and forms the GND contact 108 in the contact hole.

After various contacts are formed in such a manner, the interlayer film 131 is additionally formed over the contact formed in Step S104 and the existing interlayer film 131 around the contact, in Step S105.

In Step S106, the wiring forming section 334 forms a wiring of a metal (an electrical conductor) such as copper and aluminum in the interlayer film 131 that has been formed in Step S105.

In Step S107, the controlling section 301 determines whether a wiring layer is completed. When it is determined that all the wiring layers have not completed yet, the procedure returns to Step S105 and then a next wiring layer is formed. Namely, Steps S105 through S107 are repeated until all the wiring layers are completed.

When it is determined in Step S107 that all the wiring layers are completed, the procedure proceeds to Step S108.

In Step S108, the filter forming section 335 forms filters (not illustrated) for the corresponding pixels.

In Step S109, the collective lens forming section 336 forms collective lenses (not illustrated) for the corresponding pixels. Once the collective lenses are formed, the collective lens forming section 336 delivers the produced MOS image sensor 100 to outside.

As described above, the production apparatus 300 is capable of producing the MOS image sensor 100. As understood from the above explanations, the production apparatus 300 is capable of appropriately and easily producing the MOS image sensor 100, without the necessities of special complicated processes.

3. Third Embodiment

[Imaging Apparatus]

FIG. 14 is a block diagram illustrating a structural example of an imaging apparatus employing the above-mentioned imaging device (the MOS image sensor 100). An imaging apparatus 400 illustrated in FIG. 14 captures an image of a subject, and outputs the image of the subject as electric signals.

Referring to FIG. 14, the imaging apparatus 400 includes an optic section 411, an image sensor 412, an Analog-to-Digital (A/D) converter 413, an operational section 414, a controlling section 415, an image processing section 416, a display section 417, a codec processing section 418, and a memory section 419.

The optic section 411 includes a collective lens that adjusts a focus on the subject and collects light from the subject in focus, a diaphragm that adjusts exposure, a shutter that controls shooting timing, and the like (not illustrated).

The image sensor 412 converts incident light to an electric signal per pixel (a pixel signal), and supplies the pixel signal to the A/D converter 413.

The A/D converter 413 digitizes the pixel signal supplied at a predetermined timing from the image sensor 412 to a digital data (an image data), and supplies the digital data to the image processing section 416 serially at a predetermined timing.

The operational section 414 is composed of, for example, a jog dial (trademark), a key, a button, a touch panel, and the like. The operation section 414 receives an operational input by a user, and supplies a signal corresponding to the operational input to controlling section 415.

The controlling section 415 controls the optic section 411, the image sensor 412, the A/D converter 413, the image processing section 416, the display section 417, the codec processing section 418, and the memory section 419, and cause the sections to perform the corresponding imaging processes, based on the signal in accordance with the operational input by the user from the operational section 414.

The image processing section 416 performs various image processing operations such as color mixing correction, black level correction, white-balance adjustment, de-mosaic processing, matrix processing, gamma correction, and YC conversion with respect to the image data supplied from the A/D converter 413. The image processing section 416 supplies the image data that has undergone the image processing operations to the display section 417 and the codec processing section 418.

The display section 417 includes, for example, a liquid crystal display (LCD) panel and the like, and displays the image of the subject in accordance with the image data supplied from the image processing section 416.

The codec processing section 418 performs an encoding process of a predetermined scheme with respect to the image data supplied from the image processing section 416, and supplies the encoded data obtained here to the memory section 419.

The memory section 419 stores the encoded data from the codec processing section 418. The encoded data stored in the memory section 419 is read out to and decoded by the image processing section 416, when necessary. The image data obtained by the decoding processing is supplied to the display section 417, which in turn displays an image corresponding to the image data.

In the imaging apparatus 400 constructed as above, the present technology described above is applied to the image sensor 412. Namely, as the image sensor 412, the MOS image sensor 100 described above is utilized. Therefore, the image sensor 412 is capable of further appropriately and easily controlling the dark signal level. Therefore, the imaging apparatus 400 is capable of capturing an image of a subject and thus providing a higher quality image.

Incidentally, a structure of the imaging apparatus according to an embodiment of the present technology is not limited to the above one, but may be other structures. For example, an imaging apparatus according to an embodiment of the present technology may be data processing apparatuses (electric devices) having an imaging function, such as a cellular phone, a smartphone, a tablet device, and a personal computer, in addition to a digital still camera and a digital video camera. Additionally, the present technology may be applicable to a camera module that is mounted (or installed as a built-in device) in other data processing apparatuses.

The series of processes described above can be realized by hardware or software. When the series of processes is executed by the software, a program forming the software is installed through a network or a recording medium.

The storage medium includes, as shown in FIG. 12, for example, removable medium 321 storing the program, which is distributed for delivering the program to a user independently from the apparatus. The removable medium 321 includes a magnetic disk (including flexible disk) and an optical disk (including CD-ROM and DVD), and further includes a magneto optical disk (including MD (Mini Disc)), a semiconductor memory and the like. Alternatively, besides the removable medium 321, the above-described storage medium may include ROM for storing the program, which is distributed to the user in the form of being preliminarily installed in the apparatus, and a hard disk included in the storage section 313.

It should be noted that the program executed by a computer may be a program that is processed in time series according to the sequence described in this specification or a program that is processed in parallel or at necessary timing such as upon calling.

It should be also noted that, in this specification, the steps describing the program stored in the recording medium include not only a process performed in time series according to the sequence shown therein but also a process executed in parallel or individually, not necessarily performed in time series.

Further, in the present disclosure, a system has the meaning of a set of a plurality of configured elements (such as an apparatus or a module (part)), and does not take into account whether or not all the configured elements are in the same casing. Therefore, the system may be either a plurality of apparatuses, stored in separate casings and connected through a network, or a plurality of modules within a single casing.

Further, an element described as a single device (or processing unit) above may be configured to be divided as a plurality of devices (or processing units). On the contrary, elements described as a plurality of devices (or processing units) above may be configured collectively as a single device (or processing unit). Further, an element other than those described above may be added to each device (or processing unit). Furthermore, a part of an element of a given device (or processing unit) may be included in an element of another device (or another processing unit) as long as the configuration or operation of the system as a whole is substantially the same.

It should be understood by those skilled in the art that various modifications, combinations, sub-combinations and alterations may occur depending on design requirements and other factors insofar as they are within the scope of the appended claims or the equivalents thereof.

For example, the present disclosure can adopt a configuration of cloud computing which processes by allocating and connecting one function by a plurality of apparatuses through a network.

Further, each step described by the above mentioned flow charts can be executed by one apparatus or by allocating a plurality of apparatuses.

In addition, in the case where a plurality of processes is included in one step, the plurality of processes included in this one step can be executed by one apparatus or by allocating a plurality of apparatuses.

While the present technology has been explained taking an example of the imaging device, the present technology is applicable not only to the imaging device but also to any types of semiconductor devices.

Additionally, the present technology may also be configured as below.

(1) An imaging device including:
a semiconductor having a light-receiving portion that performs photoelectric conversion of incident light;
electrically conductive wirings; and
a contact group including contacts that have different sizes and connect the semiconductor and the electrically conductive wirings.

(2) The imaging device according to any one of (1) to (12), wherein ground contacts within the contact group have different sizes, the ground contacts connecting a pixel well region of the semiconductor and the electrically conductive wirings at a ground potential.

(3) The imaging device according to any one of (1) to (12), wherein a size of at least one of the ground contacts in an optical black region of the semiconductor is different from a size of at least one of the ground contacts in an effective pixel region of the semiconductor.

(4) The imaging device according to any one of (1) to (12), wherein the ground contacts in the optical black region have a first size, and the ground contacts in the effective pixel region have a second size that is different from the first size.

(5) The imaging device according to any one of (1) to (12), wherein the ground contacts in the effective pixel region have a predetermined size, and the ground contacts in the optical black region have different sizes.

(6) The imaging device according to any one of (1) to (12), wherein the ground contacts in an effective pixel region of the semiconductor have different sizes.

(7) The imaging device according to any one of (1) to (12), wherein each of the ground contacts in the effective pixel region has a size in accordance with an image height.

(8) The imaging device according to any one of (1) to (12), wherein sizes of the ground contacts in a part of the effective pixel region are different from sizes of the ground contacts in another part of the effective pixel region.

(9) The imaging device according to any one of (1) to (12), wherein a size of a ground contact that connects a pixel well region of the semiconductor and a corresponding one of the electrically conductive wirings at a ground potential is different from a size of another contact excluding the ground contact, within the contact group.

(10) The imaging device according to any one of (1) to (12), wherein the another contact includes at least one of
a power source contact that connects a circuit element formed in the semiconductor and a corresponding one of the electrically conductive wirings at a power source potential,
a floating diffusion contact that connects a floating diffusion formed in the semiconductor and a corresponding one of the electrically conductive wirings, and
a vertical signal line contact that connects a select transistor formed in the semiconductor and a corresponding one of the electrically conductive wirings.

(11) The imaging device according to any one of (1) to (12), wherein only the ground contact has a predetermined size, and other contacts excluding the ground contact have a plurality of different sizes.

(12) The imaging device according to any one of (1) to (12), wherein only the ground contacts have a plurality of different sizes, and other contacts excluding the ground contact have a predetermined size.

(13) An imaging apparatus including:
an imaging device including
a semiconductor having a light-receiving portion that performs photoelectric conversion of incident light,
electrically conductive wirings, and
a contact group including contacts that have different sizes and connect the semiconductor and the electrically conductive wirings; and
an image processing section that processes an image of a subject, the image having undergone the photoelectric conversion in the imaging device.

(14) A production apparatus configured to produce an imaging device, the production apparatus including:
a setting section that sets different sizes of a plurality of contacts that connect a semiconductor and electrically conductive wirings;
a semiconductor element forming section that forms elements in the semiconductor, the elements including a light-receiving portion that performs photoelectric conversion of incident light;
a contact forming section that forms the contacts in accordance with setting of the setting section; and
an electrically conductive wiring forming section that forms the electrically conductive wirings.

(15) The production apparatus according to any one of (14) to (18), wherein the setting section sets a size of a ground contact that connects a pixel well region of the semiconductor and a corresponding one of the electrically conductive wirings at a ground potential.

(16) The production apparatus according to any one of (14) to (18), wherein the setting section sets sizes of the ground contacts in an effective pixel region and in an optical black region in accordance with a difference between a dark signal level in the effective pixel region and a dark signal level in the optical black region.

(17) The production apparatus according to any one of (14) to (18), wherein the setting section sets sizes of the ground contacts in an effective pixel region in accordance with variations of dark signal levels due to positions of the ground contacts in the effective pixel region.

(18) The production apparatus according to any one of (14) to (18), wherein the setting section sets a size of the ground contact of an abnormal pixel in accordance with a difference between a dark signal level of the abnormal pixel and a dark signal level of a normal pixel.

(19) A production method performed by a production apparatus that produces an imaging device, the production method including:

setting different sizes for contacts that connect a semiconductor and electrically conductive wirings;

forming, in the semiconductor, an element including a light-receiving portion that performs photoelectric conversion of incident light;

forming the contacts in accordance with setting for sizes set for the contacts; and forming the electrically conductive wirings.

(20) A semiconductor device including:
a semiconductor having a circuit element;
electrically conductive wirings; and
a contact group including contacts that have different sizes and connect the semiconductor and the electrically conductive wirings.

The invention claimed is:

1. An imaging device, comprising:
a semiconductor having an effective pixel region and an optical black region;
conductive wirings; and
a plurality of contacts electrically connecting the semiconductor and the conductive wirings, the plurality of contacts including:
a first ground contact in the effective pixel region; and
a second ground contact in the optical black region,
wherein a first size of the first ground contact is different from a second size of the second ground contact.

2. The imaging device according to claim 1, wherein the second size of the second ground contact is smaller than the first size of the first ground contact.

3. The imaging device according to claim 1, wherein the optical black region comprises a light shielding film.

4. The imaging device according to claim 1, wherein the optical black region is in a periphery of the effective pixel region.

5. The imaging device according to claim 1, wherein a first pixel structure of the effective pixel region and a second pixel structure of the optical black region are substantially the same.

6. The imaging device according to claim 1, wherein the plurality of contacts further includes a third ground contact in the effective pixel region.

7. The imaging device according to claim 6, wherein a third size of the third ground contact is different from the first size of the first ground contact.

8. The imaging device according to claim 6, wherein a third size of the third ground contact is substantially the same as the first size of the first ground contact.

9. The imaging device according to claim 1, wherein the plurality of contacts further includes at least one of:
a power source contact configured to connect a circuit element in the semiconductor and a corresponding one of the conductive wirings at a power source potential,
a floating diffusion contact configured to connect a floating diffusion in the semiconductor and a corresponding one of the conductive wirings, or
a vertical signal line contact configured to connect a transistor in the semiconductor and a corresponding one of the conductive wirings.

10. The imaging device according to claim 1, wherein each contact of the plurality of contacts has a fourth size determined by a position in which the contact is to be formed.

11. The imaging device according to claim 1, wherein out of the plurality of contacts, the contacts positioned adjacent to an edge of the effective pixel region have a fifth size different from a sixth size of contacts positioned in a center area of the effective pixel region.

12. The imaging device according to claim 1, wherein a fourth size of each of the plurality of contacts is determined based on an image height.

13. An imaging apparatus, comprising:
an imaging device that includes:
a semiconductor having an effective pixel region and an optical black region;
conductive wirings; and
a plurality of contacts electrically connecting the semiconductor and the conductive wirings, the plurality of contacts including:
a first ground contact in the effective pixel region; and
a second ground contact in the optical black region,
wherein a first size of the first ground contact is different from a second size of the second ground contact.

14. The imaging apparatus according to claim 13, wherein the second size of the second ground contact is smaller than the first size of the first ground contact.

15. The imaging apparatus according to claim 14, wherein the optical black region comprises a light shielding film.

16. The imaging apparatus according to claim 14, wherein the optical black region is in a periphery of the effective pixel region.

17. The imaging apparatus according to claim 14, wherein a first pixel structure of the effective pixel region and a second pixel structure of the optical black region are substantially the same.

18. The imaging apparatus according to claim 14, wherein the plurality of contacts further includes a third ground contact in the effective pixel region, and wherein a third size of the third ground contact is different from the first size of the first ground contact.

19. The imaging apparatus according to claim 14, wherein the plurality of contacts further includes a third ground contact in the effective pixel region, and wherein a third size of the third ground contact is substantially the same as the first size of the first ground contact.

20. The imaging apparatus according to claim 14, wherein the plurality of contacts further includes at least one of:
a power source contact configured to connect a circuit element in the semiconductor and a corresponding one of the conductive wirings at a power source potential,
a floating diffusion contact configured to connect a floating diffusion in the semiconductor and a corresponding one of the conductive wirings, or
a vertical signal line contact configured to connect a transistor in the semiconductor and a corresponding one of the conductive wirings.

* * * * *